(12) United States Patent
Saeki et al.

(10) Patent No.: US 6,614,319 B2
(45) Date of Patent: Sep. 2, 2003

(54) PHASE-LOCKED LOOP CIRCUIT OF FRACTIONAL FREQUENCY-DIVIDING TYPE

(75) Inventors: Takanori Saeki, Tokyo (JP); Toshiyuki Tanaka, Tokyo (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 10/349,990

(22) Filed: Jan. 23, 2003

(65) Prior Publication Data

US 2003/0112079 A1 Jun. 19, 2003

Related U.S. Application Data

(63) Continuation of application No. 09/925,273, filed on Aug. 9, 2001, now abandoned.

(30) Foreign Application Priority Data

Aug. 10, 2000 (JP) ........................................ 2000-243167

(51) Int. Cl.[7] ............................. H03L 7/00; H03L 7/06
(52) U.S. Cl. ............................ 331/17; 331/14; 331/16; 331/11; 331/1 A; 331/10
(58) Field of Search ........................... 331/17, 10, 18, 331/1 A, 16, 14, 11

(56) References Cited

U.S. PATENT DOCUMENTS

| | | | |
|---|---|---|---|
| 6,222,421 B1 | * | 4/2001 | Kiyose .......................... 331/17 |
| 6,222,895 B1 | * | 4/2001 | Larsson ......................... 331/17 |
| 6,317,004 B1 | * | 11/2001 | Akagi et al. .................... 331/17 |
| 6,356,160 B1 | * | 3/2002 | Robinson et al. ............... 331/17 |
| 6,377,127 B1 | * | 4/2002 | Fukaishi ........................ 331/17 |
| 6,396,354 B1 | * | 5/2002 | Murayama et al. ............ 331/17 |
| 6,411,141 B1 | * | 6/2002 | Kanno ........................... 331/17 |
| 6,448,861 B2 | * | 9/2002 | Kawada et al. ................. 331/17 |
| 6,456,165 B1 | * | 9/2002 | Kelkar .......................... 331/17 |

* cited by examiner

Primary Examiner—Michael Tokar
Assistant Examiner—Lam T. Mai
(74) Attorney, Agent, or Firm—Hayes Soloway P.C.

(57) ABSTRACT

Disclosed is a PLL circuit that makes fractional frequency division possible without causing spurious components to be produced in the output of a VCO. The PLL circuit comprises a frequency dividing circuit for frequency-dividing the output of a VCO; a phase adjusting circuit, to which are input two clocks of different phases obtained by frequency division performed by the frequency dividing circuit, for producing an output signal having a delay time defined by a time that is the result of internally dividing a timing difference between the two clocks; a charge pump for generating a voltage conforming to a phase difference output from the phase comparator circuit; and a loop filter for smoothing the voltage conforming to the phase difference and applying the voltage to the VCO, wherein the dividing value of the timing difference in the phase adjusting circuit is represented by MF/MD, and an accumulation operation is performed in units of MF every frequency-divided clock. If the cumulative result by MF is equal to or greater than MD, then a remainder obtained by dividing the cumulative result by MD is adopted as the cumulative result and the dividing ratio of the frequency dividing circuit is set to N+1. A control signal for setting the dividing ratio of the timing difference in the phase adjusting circuit is output to the phase adjusting circuit, and a clock obtained by frequency-dividing the output of the VCO in accordance with a dividing ratio N+MF/MD is input to a phase comparator.

18 Claims, 19 Drawing Sheets

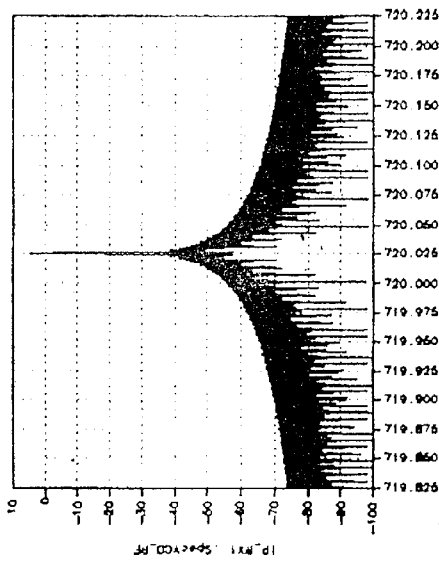
FIG. 14 b PRESENT INVENTION
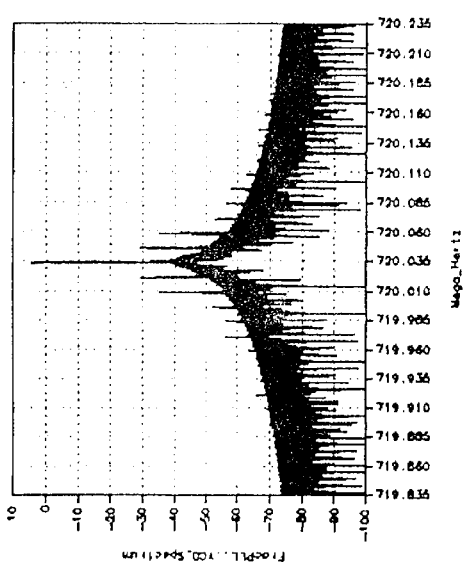
FIG. 14 d DELTA-SIGMA
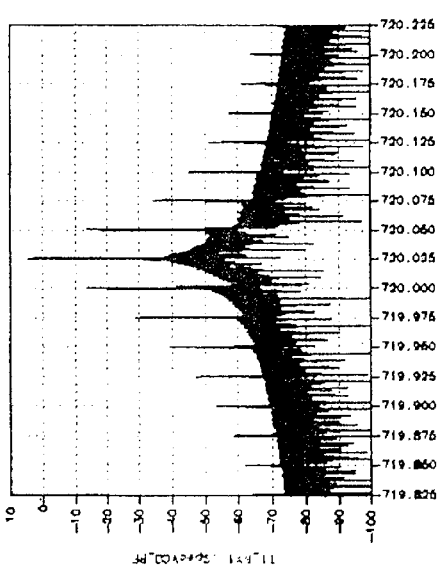
FIG. 14 a NO COMPENSATION
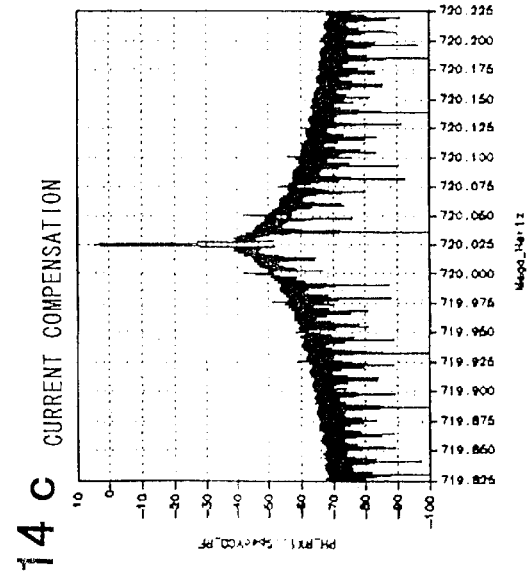
FIG. 14 c CURRENT COMPENSATION

FIG. 17       PRIOR ART

PHASE-LOCKED LOOP CIRCUIT OF FRACTIONAL FREQUENCY-DIVIDING TYPE

The present Application is a Continuation Application of prior U.S. application Ser. No. 09/925,273 filed Aug. 9, 2001 now abandoned.

FIELD OF THE INVENTION

This invention relates to a phase-locked loop circuit and, more particularly, to a phase-locked loop circuit of fractional frequency-dividing type.

BACKGROUND OF THE INVENTION

In order to control the frequency of an output signal at a frequency interval smaller than the frequency of a reference signal, the conventional practice is to employ an arrangement which averages, in terms of time, a frequency dividing ratio of a programmable frequency dividing circuit with the frequency dividing ratio being variable in an ordinary phase-locked loop (PLL) to implement a frequency dividing ratio of an accuracy finer than a decimal-point by using the average value. A configuration in which the dividing ratio of a frequency dividing circuit is changed and averaged in terms of time to implement fractional frequency division in equivalent terms is also referred to as a fractional frequency-dividing system.

If one period 1/fr of a reference signal of which frequency is fr is adopted as one clock, then, by switching the frequency dividing ratio from M to M+1 only once over L clocks (time T), the average value of the dividing ratio over the time T will be given by M+1/L.

By extending the term 1/L of this fractional part to k/L, where k=0, 1, 2, ..., the frequency dividing ratio can be set at steps of 1/L. The frequency-dividing ratio is given as follows.

$$Mave = M + k/L \, (0 = <k = <L, \text{ where } k \text{ is an integer})$$

FIG. 15 is a block diagram illustrating the structure and principle of such a fractional frequency-dividing PLL circuit. A phase comparator, a charge pump, a loop filter and a voltage-controlled oscillator of the PLL circuit have been deleted from the diagram of FIG. 15; only a frequency dividing circuit and a control circuit thereof are shown. As illustrated in FIG. 15, the PLL circuit is constituted by an accumulator 600 comprising an adder 602 and a register 603, and a variable frequency dividing circuit 601 for dividing frequency at a dividing ratio M or M+1 (where M is a predetermined integer). The adder 602 performs addition at increments of k in response to a clock whose frequency is equal to a reference frequency. The frequency dividing ratio of the frequency divider becomes M+1 when the adder 602 overflows and is M when the adder 602 does not overflow.

When the dividing ratio is changed periodically, as in the fractional frequency dividing scheme of the arrangement shown in FIG. 15, a spurious having frequency components of a period of this change is generated. In other words, if T represents a period of the change in the frequency dividing ratio of the frequency dividing circuit 601, then in the output of the PLL circuit (the output of the voltage-controlled oscillator) is generated spurious frequency components which are equally spaced by a frequency interval 1/T from the center frequency of the output of the voltage-controlled oscillator.

In order to reduce this spurious component, the specification of Japanese Patent Application Laid-Open No. 8-8741 discloses an arrangement of the kind shown in FIG. 16 as a frequency synthesizer (PLL circuit) for controlling output-signal frequency at frequency intervals that are smaller than a reference-signal frequency, thereby reducing spurious components in the vicinity of the center frequency of the output signal. The arrangement shown in FIG. 16 includes a phase comparator 701, a low-pass filter 702, a voltage-controlled oscillator 703, a variable frequency divider 704, a frequency dividing adder 711, accumulators 706 to 709, and a frequency-division control circuit 705. In accordance with a value set from the frequency-division control circuit 705, the variable frequency divider 704 divides and outputs the frequency of the output signal from voltage-controlled oscillator (VCO) 703. The phase comparator 701 compares a phase of the output of the variable frequency divider 704 and a phase of a reference frequency and outputs a phase difference. The output of the phase comparator 701 is input to the voltage-controlled oscillator 703 via the low-pass filter 702 and control is performed in such a manner that the signal obtained by frequency-dividing the Output signal of the voltage-controlled oscillator 703 will be synchronized to the reference signal. The Output of the voltage-controlled oscillator 703 is delivered as the output signal and is input to the variable frequency divider 704.

The frequency-division control circuit 705 comprises accumulators 706, 707, 708, and 709, a fractional part calculating circuit 710 and the frequency dividing ratio adder 711 Each of these circuits operates with the output of the variable frequency divider 704 serving as the clock. The accumulator 706, which comprises an adder and a register, adds the value of the register to a fractional data, which has been provided externally, synchronizing with the clock, and updates the register. The accumulator 707, which comprises an adder and a register, adds the output value of the accumulator 706 to the value of its register in sync with the clock, thereby adding 1 to the least significant bit, and updates the values value of its register. The accumulators 707 and 708 are identically constructed. The adder of each accumulator outputs the carry signal of its most significant bit and inputs the carry signal to the decimal calculating circuit 710.

The fractional part calculating circuit 710 operates in synchronization with the clock. When the accumulator 706 generates a carry signal, the fractional part calculating circuit 710 generates +1 after three clock pulses. When a carry signal enters from the accumulator 707, the fractional part calculating circuit 710 generates +1 after two clock pulses and +1 after three clock pulses. When a carry signal enters from the accumulator 708, the fractional part calculating circuit 710 generates in turn +1 after one clock pulse; −2 after two clocks pulses a +1 after three clock pulses. When a carry signal enters from the accumulator 709, the fractional part calculating circuit 710 generates in turn +1 after 0 clock pulses, −3 after one clock pulse, +3 after two clock pulses and −1 after three clock pulses.

The total sum of the values generated by the carry signals produced by each of the accumulators at each clock is output to the fractional part calculating circuit 710. The frequency dividing adder 711 adds the decimal output of the fractional part calculating circuit 710 and the value of the integer, and the result becomes the output of the frequency-division control circuit 705, which sets the dividing ratio of the variable frequency divider 704. As a result, a change in the dividing ratio is produced clock by clock, the frequency components of the change in dividing ratio are raised and the low frequency components are lowered. The changes in the dividing ratio brought about by the carry signals from the accumulators 707 to 709 have no influence upon the averaged dividing ratio because the respective averages over time are zero; only the carry produced by the accumulator 706 contributes to the averaged dividing ratio.

If M represents an integer data, K a fraction data and n the number of bits constituting the accumulator 706, the accumulator 706 will generate K carries over $2^n$ clocks and the dividing ratio will be made M+1 K times. The averaged dividing ratio, therefore, will be $M+K/2^n$. If fr represents the frequency of the reference signal, then the output frequency will be $fr \cdot (M+K/2^n)$.

Though the frequency component of a change in dividing ratio appears as a spurious Output from the VCO, the frequency of the change in dividing ratio resulting from connecting the accumulators in four stages increases and the low frequency component decreases. The periodic change is disturbed by always adding 1 to the least significant bit of the accumulator 707 and a spurious component is not produced at a frequency offset by $fr \cdot K/2n/4$ from the center frequency of the output signal. The effect of diminishing the low frequency component, therefore, is not sacrificed.

An arrangement of the kind shown in FIG. 17 (which uses the so-called "Delta-Sigma" technique) also is known as a PLL circuit of the fractional frequency-dividing type. Here a dividing-ratio control circuit 908 for controlling the dividing ratio of a frequency dividing circuit 907 varies and controls a change delta-N in dividing ratio based upon the results of calculations by accumulators operated by a frequency-divided clock. The period of this variation is obtained by a predetermined modulo calculation.

Also known is a PLL circuit having means which compensates for the charge and discharge current of a charge pump resulting from the occurrence of a spurious signal caused by periodically varying a frequency dividing ratio. For example, as shown in FIGS. 18 and 19, charge pumps 831, 832 for charging and discharging a capacitance by up and down signals output from a phase comparator 803 each have a compensating charge pump. Each of the charge pumps has an array of unit charge pumps CP comprising a P-channel MOS transistor turned on by the up signal and an N-channel MOS transistor turned on by the down signal. The sum of the current outputs of the plurality of unit charge pumps CP is extracted as the output. A reference current is varied by a digital-to-analog converter 836 and then applied to the compensating charge pumps, and the compensating current outputs of these charge pumps are turned on and off by the output of a decoder 834, whereby current is varied.

SUMMARY OF THE DISCLOSURE

In all of the arrangements described above, fractional frequency division is achieved by changing and then averaging the dividing ratio of a variable frequency divider, and a spurious signal is produced in the output of a voltage-controlled oscillator due to the change in the dividing ratio of the frequency divider. The above-mentioned arrangements are for suppressing and compensating for such spurious signals. In other words, none of these arrangements has a construction that is free of spurious signals.

As a consequence, a problem with the prior art is that the circuitry for reducing spurious signals becomes large in scale. For example, arrangements (FIGS. 18 and 19) for suppressing spurious signals by compensating charge-pump current involve circuitry of very large scale.

Accordingly, it is an object of the present invention to provide an entirely novel PLL circuit that makes fractional frequency division possible without causing spurious signals to be produced in the output of a voltage-controlled oscillator.

The foregoing object is accomplished in accordance with one aspect of the present invention by providing a PLL circuit comprising: a phase comparator circuit which receives a reference clock from one input terminal thereof to output a phase difference; a charge pump which generates a voltage conforming to the phase difference output from said phase comparator circuit; a loop filter which performs smoothing the voltage conforming to the phase difference; a voltage-controlled oscillator which receives an output voltage of said loop filter as a control voltage to output a clock having an oscillation frequency determined by the control voltage; a frequency dividing circuit which performs integral frequency-division of an output clock output from said voltage-controlled oscillator; a phase adjusting circuit which receives two frequency-divided clocks of mutually different phases obtained by integral frequency division at said frequency dividing circuit to produce an output signal having a delay time defined by a time that is the result of dividing a timing difference between the two frequency-divided clocks in accordance with a prescribed interior division ratio, said interior division ratio being made variable; and control means which provides a signal for variably setting, every integral frequency dividing interval, the interior division ratio with which the timing difference is divided in the phase adjusting circuit; wherein a frequency-divided clock that is output from said phase adjusting circuit is fed to another input terminal of said phase comparator circuit so that a phase of the frequency-divided clock is compared with that of the reference clock.

In accordance with another aspect of the present invention, the dividing ratio for frequency dividing the clock output of the voltage-controlled oscillator is N+MF/MD, which is defined by an integral dividing ratio N and a fractional dividing ratio MF/MD. The frequency dividing circuit has its integral dividing ratio set to N or N+1, and the control means has an adder circuit for performing addition cumulatively in units of MF based upon the frequency-divided clock obtained by integral frequency division.

In accordance with another aspect of the present invention, the PLL circuit further includes a control circuit which, if the result of cumulative addition is equal to or greater than MD, adopts a remainder obtained by dividing this result by MD as a new cumulative result, and which if, a value of addition of MF to the present cumulative result, is equal to or greater than MD, sets to N+1 the dividing ratio of the frequency dividing circuit for defining the integral frequency dividing interval; and a decoder circuit for outputting, to the phase adjusting circuit, a weighting signal for deciding, on the basis of the cumulative result, the interior division ratio for dividing the timing difference in the phase adjusting circuit.

With the PLL circuit according to the present invention, a clock having a frequency of fvco/(N+MF/MD), which is obtained by dividing a frequency fvco of the output of the voltage-controlled oscillator by the dividing ratio N+MF/MD at all times, is input to the phase comparator circuit.

In accordance with another aspect of the present invention, the phase adjusting circuit includes an interpolator comprises: a logic circuit, which receives two clocks of mutually different phases from two input terminals as first and second input signals, for outputting the result of a prescribed logic operation of the first and second input signals; a first switch element, which is connected between a first power supply and an internal node and to a control terminal whereof an output signal from said logic circuit is input, for being turned on when both the first and second input signals are at a first value to thereby form a path that charges the internal node; a plurality of series circuits, each of which comprises a second switch element turned on when the first input signal is at a second value and a third switch element turned on and off based upon the weighting signal, a plurality of series circuits being connected in parallel between the internal node and a second power supply; and a plurality of series circuits, each of which comprises a fourth switch element turned on when the second input signal is at the second value and a fifth switch element turned on and off based upon the weighting signal, a plurality of series circuits being connected in parallel between the internal node and the second power supply.

Still other objects and advantages of the present invention will become readily apparent to those skilled in this art from the following detailed description, wherein only the preferred embodiment of the invention is shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 14a is a frequency spectrum of the output of a voltage-controlled oscillator in an uncompensated fractional dividing-type PLL circuit, FIG. 14b a frequency spectrum of the output of a voltage-controlled oscillator in a PLL circuit according to an embodiment of the present invention, FIG. 14c a frequency spectrum of the output of a voltage-controlled oscillator in a conventional current-compensated PLL circuit, and FIG. 14d a frequency spectrum of the output of a voltage-controlled oscillator in a Delta-Sigma-type PLL circuit;

PREFERRED EMBODIMENTS OF THE INVENTION

A preferred embodiment of the present invention will now be described.

Figure 1:
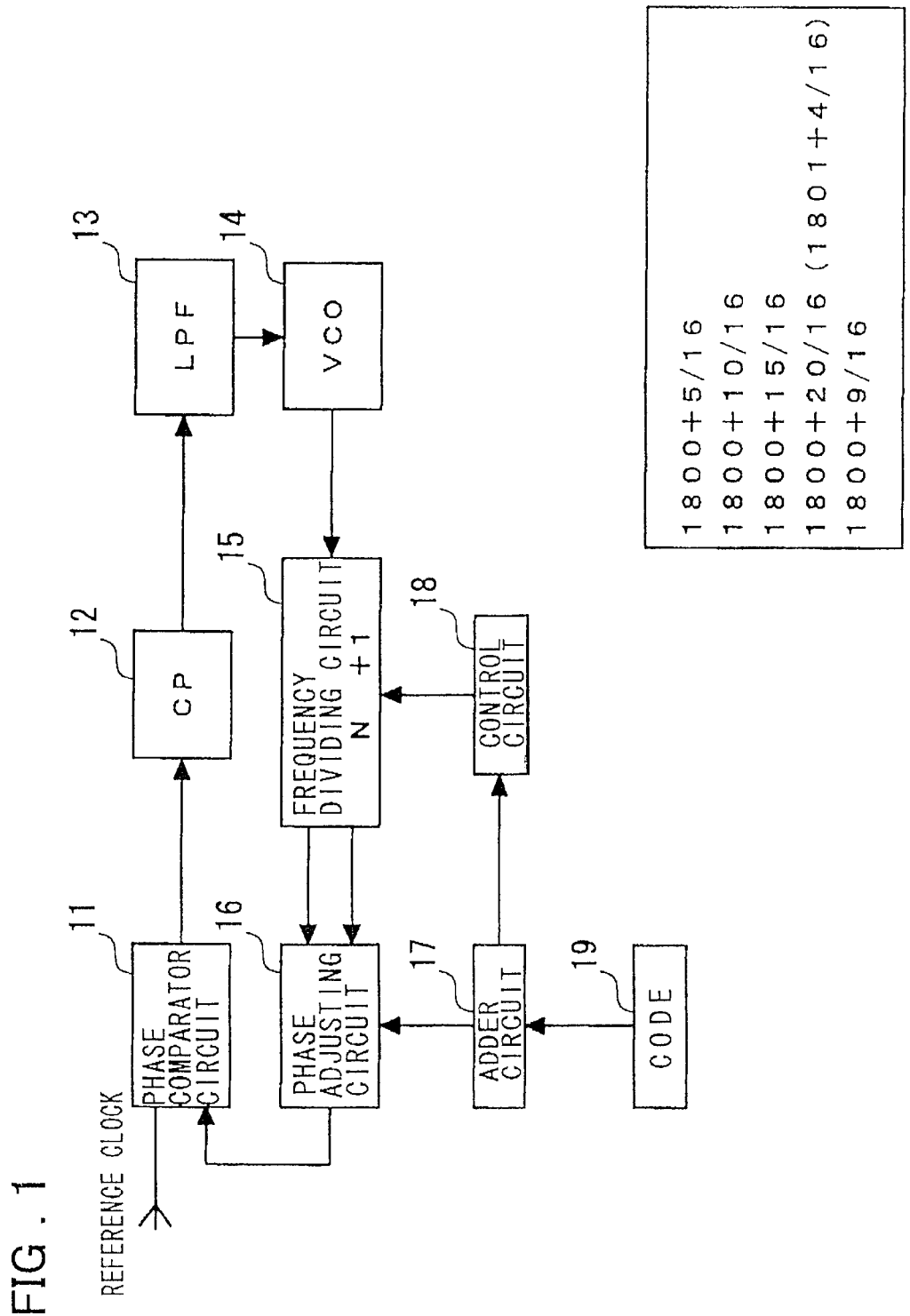
FIG. 1 is a block diagram illustrating the basic structure of an embodiment of the present invention.

In a first embodiment of the present invention, as shown in FIG. 1, a PLL circuit comprises: a frequency dividing circuit (15) for frequency dividing an integral part of an output signal from a voltage-controlled oscillator (14); a phase adjusting circuit (16), which receives two frequency-divided clocks of mutually different phases obtained by integral frequency division of the frequency dividing circuit (15) and generates an output signal which includes, as a delay time, a time that is the result of internally dividing a timing difference between the two frequency-divided clocks in accordance with a prescribed interior division ratio; a phase comparator circuit (11) for receiving a frequency-divided clock output from the phase adjusting circuit (16) and a reference signal to detect a phase difference between the signals received; a charge pump (12) for generating a voltage conforming to the phase difference output from the phase comparator circuit (11); and a loop filter (13) for supplying an output voltage, which is obtained by smoothing the voltage conforming to the phase difference, to the voltage-controlled oscillator (14) as a control voltage. The PLL circuit further comprises an adder (an accumulator comprising an adder and a register) (17), in which MF represents an integer that defines a numerator of a fractional frequency division and MD represents an integer that defines a denominator of the fractional frequency division, for performing addition cumulatively in units of MF based upon the integral frequency-divided clocks obtained from the frequency dividing circuit (15). If the result of cumulative addition by the adder circuit (17) is equal to or greater than MD, the adder circuit (17) Gives notification to this effect by outputting a carry (overflow) signal to a control circuit (18). A remainder obtained by dividing the cumulative result by MD is adopted as a new cumulative result MF'. The frequency dividing circuit (15), which has received the above-mentioned notification, changes the integral-dividing ratio from N to N+1

In a case where the cumulative result obtained by the adder circuit (17) is less than MD, the cumulative result is kept as is and the integral-dividing ratio of the frequency dividing circuit (15) is made N. On the basis of this cumulative result, a weighting signal for setting the internal ratio of the timing difference in the phase adjusting circuit (16) is output.

In accordance with the present invention as described above, a signal obtained by frequency-dividing, at all times, the output (frequency fvco) of the voltage-controlled oscillator (14) by the dividing ratio N+MF/MD is input to the phase comparator circuit (11) [where a frequency fs comprises fvco/(N+MF/MD) and the frequency spectrum theoretically is a single spectrum), whereby the phase of this signal is compared with that of the reference clock.

The control circuit (18) has a counter (not shown) and includes control means which, on the basis of the count value of the counter, exercises control so as to transmit, to the input of the phase adjusting circuit (100 in FIG. 3 and 200 in FIG. 9) whenever the integral frequency dividing interval N or N+1 elapses, rising edges or falling edges of two clock signals (IN2 and IN3 in FIG. 4) of different phases output from the frequency dividing circuit, or of two clock signals (A and B in FIG. 10) of different phases generated from one clock signal (IN1 in FIG. 10) obtained by frequency division by the frequency dividing circuit.

An arrangement may be adopted in which power consumption is controlled on the basis of a power control signal (POWW in FIG. 3) from a control circuit (116 in FIG. 3) by activating an ECL/CMOS circuit (108$_1$) only for a predetermined period of time starting from a timing stipulated by the integral frequency dividing interval, and deactivate this circuit at all other times. The ECL/CMOS circuit is for converting an ECL-level signal, which is output from a prescaler (107 in FIG. 3) constituted by an ECL, to the CMOS level, wherein the prescaler has a dividing ratio smaller than the integral dividing ratio N.

In the present invention, an arrangement may be adopted in which a signal output from a prescaler (207 in FIG. 9) is input to an ECL/CMOS circuit (208 in FIG. 9) and the PLL circuit is provided with a D-type flip-flop (214 in FIG. 9) having a data input terminal to which a signal from the ECL/CMOS circuit (208 in FIG. 9) is fed, and a D-type flip-flop (215 in FIG. 9) having a data input terminal to which an output signal from a data output terminal of the D-type flip-flop (214) is fed, with a timing control signal (WIE) from a control circuit (213) being fed to clock input terminals of the D-type flip-flops (214, 215) and the outputs from the data output terminals of the D-type flip-flops being fed to input terminals of respective ones of interpolators in the phase adjusting circuit (200).

In an embodiment of the present invention, a phase adjusting circuit comprises an interpolator for producing an output signal the delay time of which is stipulated by a time obtained by dividing the timing difference between two input signals thereof at a prescribed internal ratio. The interpolator comprises: a logic circuit (NAND 01 in FIG. 7), to which two clocks of mutually different phases are applied from two input terminals as first and second input signals (IN1, IN2), for outputting the result of a prescribed logic operation between the first and second input signals; a first switch element (MP1), which is connected between a first power supply (VCC) and an internal node (N31) and to a control terminal whereof an output signal from the logic circuit is input, for being turned on when both the first and second input signals are at a first value to thereby form a path that charges a capacitance (C) at the internal node; and a non-inverting or inverting buffer circuit (INV3) having the internal node connected to an input terminal thereof for changing an output logic value if a relationship of magnitudes between a voltage level at the internal node (terminal voltage of the capacitance C) and a threshold value has been inverted; a plurality of series circuits, each of which comprises a second switch element (MN11) turned on when the first input signal is at a second value and a third switch element (MN21) turned on and off based upon a weighting signal (SB1–16), being connected in parallel between the internal node (N31) and a second power supply (GND); and a plurality of series circuits, each of which comprises a fourth switch element (MN12) turned on when the second input signal is at the second value and a fifth switch element (MN22) turned on and off based upon a weighting signal (S1–16), being connected in parallel between the internal node (N31) and the second power supply.

In the PLL circuit according to the present invention, the above-described interpolator constituting the phase adjusting circuit may be so arranged that a plurality of serially connected switch elements and capacitors are connected in parallel between the internal node (N31 in FIG. 7) and the second power supply (GND), and the plurality of switch elements are turned on or off by a control signal supplied to the control terminals of the plurality of switch elements to thereby decide the capacitance applied to the internal node (N31). If this arrangement is adopted, the frequency range over which the interpolator operates is expanded.

In the PLL circuit according to this embodiment of the invention, the above-described interpolator constituting the phase adjusting circuit is such that each of the second, third, fourth and fifth switch elements comprises at least a prescribed number (K) of elements, L-number (where L is 0 to K) of the third switch elements (MN21 in FIG. 7) are turned on by the weighting signals (SB1–16) supplied to the group of third switch elements, (K–L)-number of the fifth switch elements (MN22 in FIG. 7) are turned on by the weighting signals (S1–16) supplied to the group of fifth switch elements, a signal is output that corresponds to a timing obtained by internally dividing the timing difference between the first and second input signals based upon K using 1/K of this timing difference as a unit (MD in the case of the fractional dividing ratio MF/MD), and the internal ratio of the timing difference is varied by varying the value of L. Furthermore, the weighting signals (S1–16) and the weighting signals (SB1–16) are such that corresponding bits are mutually complementary.

In accordance with this embodiment of the present invention, the dividing ratio of the frequency-divided clock applied to the phase comparator circuit is fixed at N+MF/MD, and spurious signals are not produced. That is, the present invention is not designed to obtain the dividing ratio by averaging, as in the conventional fractional frequency dividing technique. Since each frequency-divided clock cycle is the frequency-dividing period of N+MF/MD, in theory no spurious noise is produced.

Embodiments of the present invention will now be described with reference to the drawings in order to explain the invention in more detail.

FIG. 1 is a block diagram illustrating the structure of an embodiment of the present invention. As shown in FIG. 1, a PLL circuit according to this embodiment includes a phase comparator circuit 11 receiving an input clock (a reference clock) from one input terminal thereof for outputting a phase difference; a charge pump 12 for generating a voltage conforming to the phase difference by charging or discharging a capacitor in dependence upon the phase difference (UP/DOWN signal) output by the phase comparator circuit 11; a loop filter 13 comprising a low-pass filter (LPF) for smoothing an output voltage conforming to the phase difference; a voltage-controlled oscillator (VCO) 14 which receives the output voltage of the loop filter 13 as a control voltage to output a clock signal having an oscillation frequency stipulated by the control voltage; a frequency dividing circuit 15 for frequency dividing an output clock of the voltage-controlled oscillator 14 by an integer value of N or N+1; and a phase adjusting circuit 16, which receives two frequency-divided clocks of mutually different phase obtained by frequency division by the frequency dividing circuit 15, and produces an output signal having a delay time defined by a time that is the result of internally dividing, at a prescribed internal ratio, the timing difference between rising edges or falling edges of the two clocks.

The phase adjusting circuit 16 is so arranged that the interior division ratio (dividing value) of the timing difference between two clocks is set variably based upon a weighting control signal.

The output clock of the phase adjusting circuit 16 is fed to a second input terminal of the phase comparator circuit 11, which detects the phase difference between this clock signal and the input clock.

An adder circuit 17 comprises an accumulator, which is constituted by an adder and register for incrementing from the initial state (e.g., 0), on the basis of the integral frequency-divided clock, a code (MF) 19 that decides the numerator of the fractional dividing ratio MF/MD. The result of accumulation is incremented successively in the manner MF, 2MF, 3MF, . . . .

In a case where the result of accumulation from the adder circuit 17 is equal to or greater than the denominator MD (which corresponds to a division step at which the timing difference is divided in the phase adjusting circuit 16) of the fractional dividing ratio MF/MD, the remainder obtained by dividing the result of accumulation by MD is output to the phase adjusting circuit 16 as a new cumulative result.

In a case where the sum obtained by adding MF to the present cumulative result is equal to or greater than MD, the adder circuit 17 so notifies a control circuit 18 as by a carry signal. On receipt the notification, the control circuit 18 changes the integral-dividing ratio of the frequency dividing circuit 15 in the next integral frequency-dividing interval from N to N+1.

In the next integral frequency-dividing interval, the frequency dividing circuit 15 frequency-divides the output clock from the voltage-controlled oscillator 14 by N+1. The phase adjusting circuit 16 outputs a signal having a timing obtained by dividing, by a dividing value equal to (remainder obtained by dividing cumulative result by MD)/MD, the timing difference between rising or falling edges of the clocks at the start of the N frequency dividing interval that immediately follows the (N+1) frequency dividing interval. The adder circuit 17 has a decoder (not shown) for decoding the result of addition and supplying the decoded signal to the phase adjusting circuit 16.

The control circuit 18 exercises control to transmit or not transmit the frequency-divided clocks from the frequency dividing circuit 15 to the phase adjusting circuit 16. More specifically, an arrangement may be adopted in which the control circuit 18 has a counter for counting a signal obtained by frequency-dividing the output signal of the voltage-controlled oscillator at a predetermined integral dividing ratio using a prescaler or the like, with the control circuit 18 performing control in such a manner that when the integral frequency dividing interval has elapsed from the time indicated by the value of the count, the transition edges of the signals having the two mutually different phases output by the frequency dividing circuit 15 are transmitted to the input side of the phase adjusting circuit 16.

The resolution of the dividing value (interior division ratio) of the timing difference between the two frequency-divided clocks of different phases output from the frequency dividing circuit 15 is at a step of MD, and the internal division ratio of the timing difference is variably set based upon the control signal that enters from the adder circuit 17. The structure of the phase adjusting circuit 16 will be described later in greater detail.

An example of operation of the PLL circuit according to the embodiment of the invention shown in FIG. 1 will now be described for a case where the resolution of the timing difference of phase adjusting circuit 16 is 16 steps, the code signal 19 is "5" and the integral frequency dividing ratio of the frequency dividing circuit 15 is "1800".

The timing-difference dividing value of the phase adjusting circuit 16 is varied every frequency-divided clock (at the frequency dividing period 1800 or 1801), i.e., in the following manner every integral frequency-divided clock obtained by frequency division using the frequency dividing circuit 15:

5/16 (integral frequency dividing ratio 1800),
10/16,
15/16,
20/16=4/16 (integral frequency dividing ratio 1801),
9/16 (integral frequency dividing ratio 1800),
14/16,
19/16=3/16 (integral frequency dividing ratio 1801),
8/16,
13/16,
18/16=2/16 (integral frequency dividing ratio 1801),
7/16,
12/16,
17/16=1/16 (integral frequency dividing ratio 1801),
6/16,
11/16,
16/16=0/16 (integral frequency dividing ratio 1801),
5/16

At this time the value of the numerator is summed with modulo 16. That is, if the result of addition exceeds 16, the remainder of 16 is adopted as the new numerator.

For example, if 5/16 is added when the present value is 15/16, we have 15/16+5/16=20/16, so that 4/16 (integral frequency dividing ratio 1801) is obtained.

In this case, the control circuit 18 changes the next integral frequency dividing ratio in the frequency dividing circuit 15 from 1801 to 1800, and the phase adjusting circuit 16, to which is input the immediately following frequency-divided clock obtained by frequency dividing the output clock (period tCK) of voltage-controlled oscillator 14 by 1801, produces an output signal having a timing that is 4/16 of the timing difference tCK of the input clocks.

The period of the frequency-divided clock obtained by frequency division using the frequency dividing circuit 15 and phase adjusting circuit 16 and input to the phase comparator circuit 11 becomes 1800+5/16 in all cycles (frequency dividing periods).

In the present invention, the period of the clock (period tCK) obtained by frequency-dividing the output of the voltage-controlled oscillator 14 and fed to the phase comparator circuit 11 becomes (1800+5/16)tCK. In other words, in the present invention, the frequency dividing period in the loop does not change. As a result, a spurious signal is not generated in the output of the voltage-controlled oscillator 14. Such a spurious signal has been brought about heretofore by changing over the dividing ratio of the frequency dividing circuit.

Figure 2:
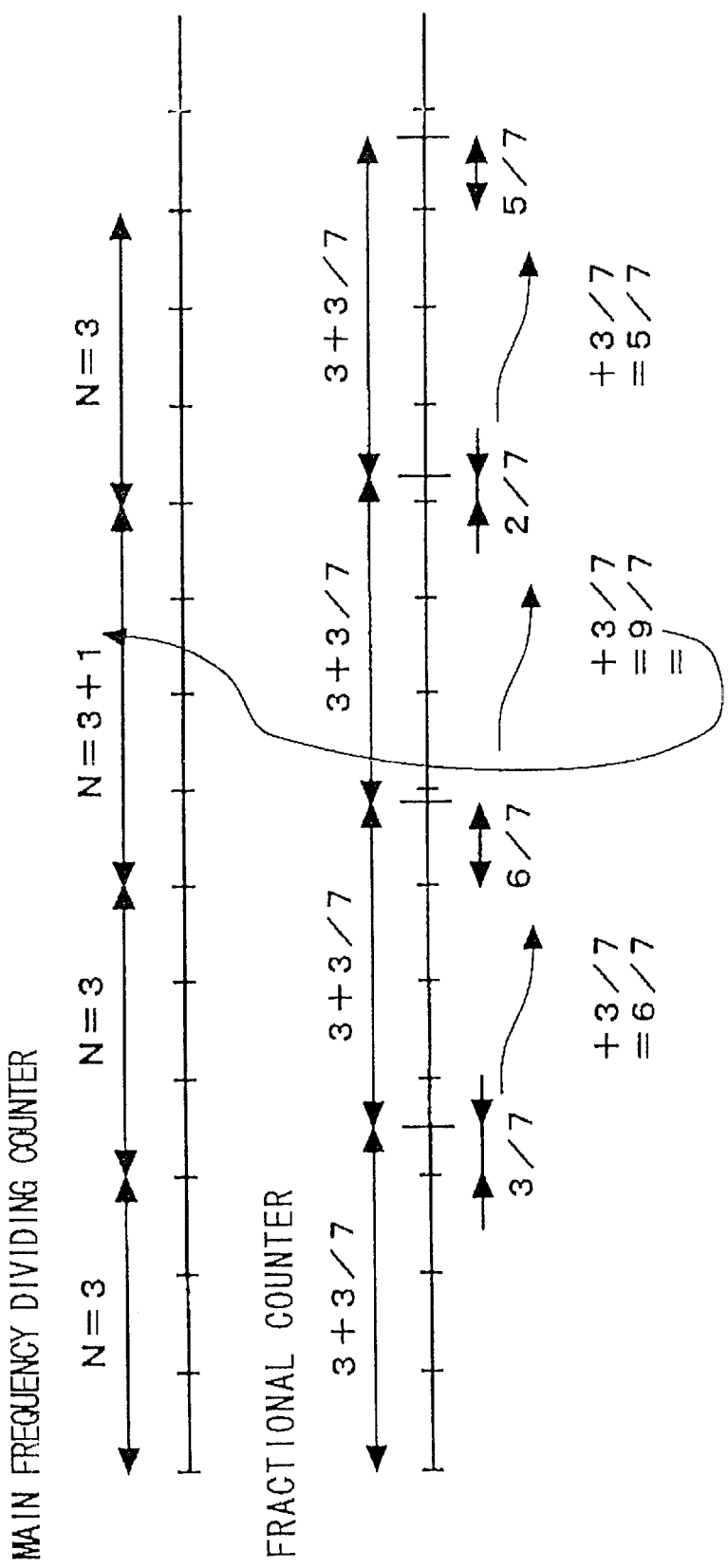
FIG. 2 is a diagram useful in describing the operation of a first embodiment of the present invention.

FIG. 2 is a diagram useful in describing the operation principle of the present invention. FIG. 2 schematically illustrates the operation principle for a case where the resolution at which the timing difference of the phase adjusting circuit 16 is divided is seven steps, the integral frequency dividing ratio is 3 and the fractional frequency dividing ratio is 3/7. The code 19 is assumed to be 3, which is the numerator of the fractional frequency dividing ratio 3/7.

The phase adjusting circuit 16 changes the dividing value of the timing difference in the following manner:

3/7 (frequency division number 3),

3/7+3/7=6/7 (frequency division number 3),

3/7+3/7+3/7=9/7=2/7 [frequency division number 3+1; timing obtained by dividing, at 2/7, the timing difference (clock period tCK) from the rising edge of the clock whose frequency has been divided by 4].

2/7+3/7=5/7 (frequency division number 3),

5/7+3/7=8/7=1/7 [frequency division number 3+1; timing obtained by dividing, at 1/7, the timing difference (clock cycle tCK) from the leading edge of the clock whose frequency has been divided by 4], 1/7+3/7=4/7 (frequency division number 4), 4/7+3/7=7/7=0/7 (frequency division number 3+1)

Thus, seven cycles in 24 clock cycles, i.e., a frequency dividing ratio of 3+3/7 is obtained.

As shown in FIG. 2, the phase adjusting circuit 16 outputs a signal at a timing of 3/7 of the clock cycle tCK from the edge of a third clock pulse, outputs a signal at a timing of 6/7 of the clock cycle tCK from the edge of a sixth clock pulse, outputs a signal at a timing of 2/7 of the clock cycle tCK from the edge of a tenth clock pulse and outputs a signal at a timing of 5/7 of the clock cycle tCK from the edge of a 13th clock pulse.

In FIG. 2, a main frequency dividing counter (a counter included in the control circuit of FIG. 1 for performing integral frequency division) exercises control through which the integral frequency dividing ratio N of the frequency dividing circuit 15 can be changed in such a manner as 3, 3, 3+1, 3, . . . . More specifically, in a case where the result of adding 3 to the current value of addition using the adder circuit 17 is equal to greater than 7, the main frequency dividing counter of the control circuit 18 increments by 1 the integral frequency dividing ratio of the frequency dividing circuit 15 in the next cycle (integral frequency dividing interval).

Figure 3:
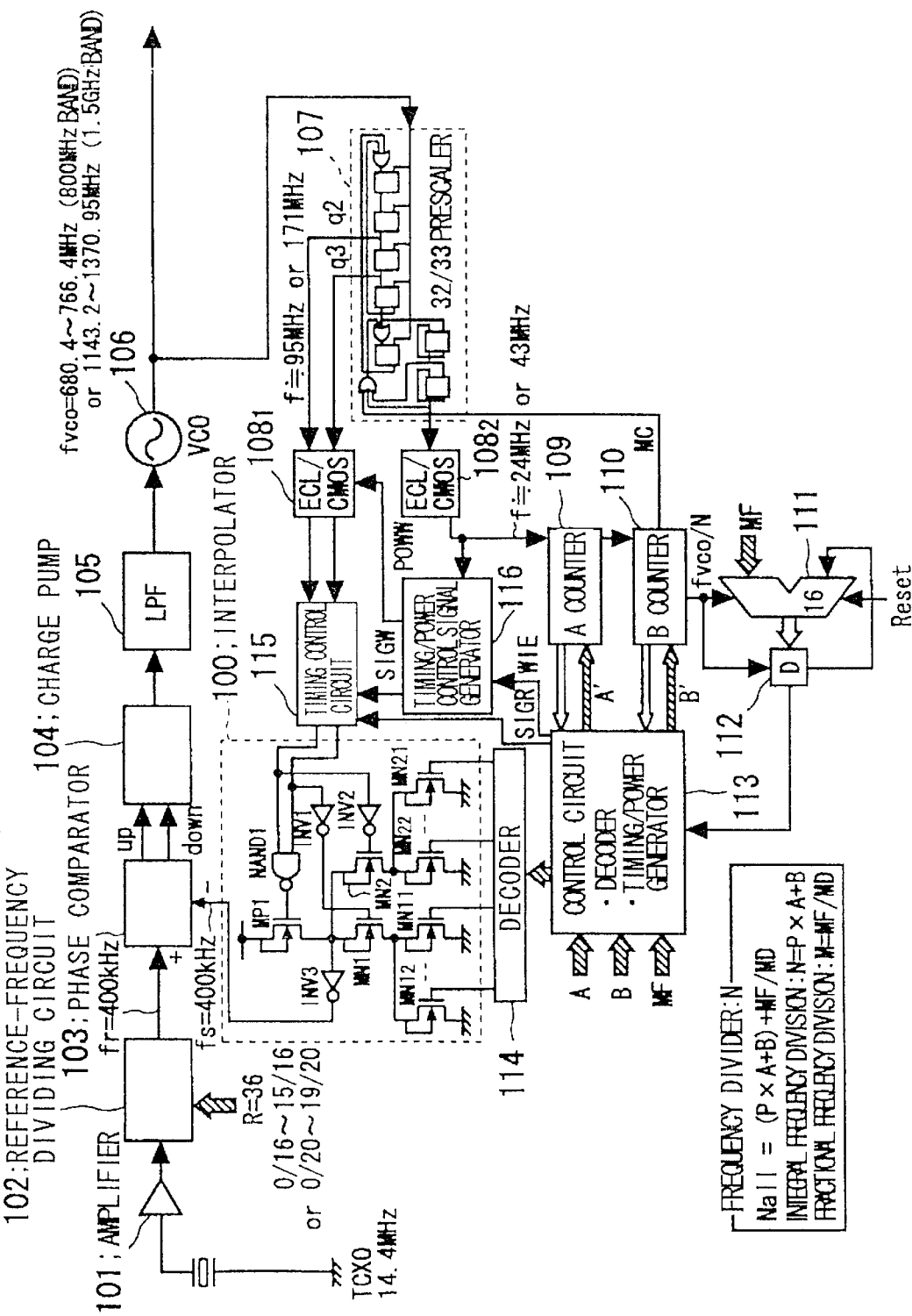
FIG. 3 is a block diagram illustrating the structure of the first embodiment.

FIG. 3 is a diagram illustrating the detailed structure of an example of a PLL circuit according to this embodiment of the present invention. As shown in FIG. 3, the PLL circuit according to this embodiment of the invention comprises an amplifier 101 for amplifying the output (14.4 MHz) of all externally mounted crystal oscillator (TCXO; temperature compensated crystal oscillator); a reference-frequency dividing circuit 102 for frequency-dividing the output of the amplifier 101; a phase comparator 103 for comparing a phase of the reference signal (frequency f is about 400 kHZ) frequency-divided by the reference-frequency dividing circuit 102 with that of a frequency-divided clock(frequency f is about 400 kHZ); a charge pump 104 for charging a capacitor (not shown) when the phase comparator 103 is outputting an UP signal in accordance with the result of the phase comparison and for discharging the charge, which has accumulated in the capacitance, when the phase comparator 103 is outputting a DOWN signal in accordance with the result of the phase comparison; a low-pass filter (loop filter) LPF 105 for smoothing the terminal voltage of the capacitance charged/discharged by the charge pump 104; a voltage-controlled oscillator (VCO) 106, to which the output voltage of the LPF 105 is input as a control voltage, for oscillating at a frequency conforming to the control voltage and outputting a signal having this frequency (800-MHz band or 1.5-GHz band); a 32/33 prescaler 107 comprising an ECL (emitted-coupled logic) for frequency-dividing the output of the voltage-controlled oscillator 106 by a dividing ratio 32 or 33; and an interpolator 100 functioning as a phase adjusting circuit of this invention, to which two signals frequency-divided by the 32/33 prescaler 107 are input, for outputting a signal having a delay time obtained by dividing the time difference between the two inputs based upon a control signal output from a decoder 114.

Further, 1/8 frequency-divided outputs of the 32/33 prescaler 107 (second and third stages of D-type flip-flops) are input to a timing control circuit 115 via an ECL/CMOS converter $108_1$. Two signals converted to the CMOS level are fed to respective ones of two input terminals of the interpolator 100.

Further, a 32/33 frequency-divided output (24 MHz or 43 MHz) of the 32/33 prescaler 107 is fed to a timing/power control signal generator 116 and to an A counter 109 via an ECL/CMOS converter $108_2$.

The A counter 109 outputs an overflow (carry) signal in a case where a 32 frequency-divided output of the 32/33 prescaler 107 has been counted A' times based upon a set count value A' from a control circuit 113. Upon receiving this overflow signal, a B counter 110 places a signal MC at the high level to place the 32/33 prescaler 107 in the divide-by-33 mode. On the basis of a set count value B' from the control circuit 113, the B counter 110 performs counting B' times (the 32/33 prescaler 107 cycles B' times in the divide-by-33 mode).

By virtue of this counter arrangement, the B counter 110 outputs a clock obtained by frequency-dividing the output signal (frequency fvco) of the voltage-controlled oscillator 106 by the integral frequency dividing ratio N=32×m+33×n (where m, n are decided by A', B').

In order to make the integral dividing ratio equal to N+1 in this case, we have 32×(m−1)+33×(n+1)=32×m+33×n+1= N+1, and hence +1 of the integral dividing ratio is achieved by changing settings of the count values in the A counter 109 and B counter 110.

The signal fvco/N, which is obtained by integral frequency-dividing the output signal (frequency fvco) of the voltage-controlled oscillator 106 by the 32/33 prescaler 107, A counter 109 and B counter 110, is supplied to an adder 111 and to a register 112, which stores the result of addition by the adder 111.

The output MC of the changes the dividing ratio of the 32/33 prescaler 107, which operates as a 33 prescaler 107 when the signal MC is at the high level.

The integer MF, which defines the numerator of the fractional dividing ratio MF/MD, and the output (the current value from the adder 111) of the register 112 are input to the adder 111. On the basis of the frequency-divided clock output from the B counter 110, the adder 111 performs addition at increments of the numerator MF every cycle (the integral frequency dividing interval) obtained by frequency-dividing, by N or N+1, the oscillation frequency fvco (800 MHz or 1.5 GHz) of the voltage-controlled oscillator 106.

The set count values A, B of the counters 109, 110, respectively, and the numerator MF of the fractional dividing ratio is input to the control circuit 113. The control circuit 113 sets the count upper-limit values A' and B' in the A counter 109 and B counter 110, respectively. In addition, on the basis of count outputs of the A counter 109 and B counter 110 and the cumulative result (output of the register 112) obtained by the adder 111, the control circuit 113 supplies the decoder 114 with the weighting signal of the interpolator 100, outputs a timing control signal WIE to the timing/power control signal generator 116 as an active state at a predetermined timing at the integral dividing ratio intervals, and further outputs a gate control signal SIGR to the timing control circuit 115.

Upon receiving the control signal WIE in the active state, the timing/power control signal generator 116 outputs a gate signal SIGW to the timing control circuit 115 so that two frequency-divided clocks from the ECL/CMOS circuit are supplied to the interpolator 100.

As a result of the foregoing, the interpolator 100 is supplied with a signal every cycle obtained by frequency-dividing the output clock of the voltage-controlled oscillator 106 by the integral dividing ratio N or N+1.

Let MD represent a step(resolution) of the timing difference between two input clocks in the interpolator 100. On the basis of the weighting control signal output from the decoder 114, the interpolator 100 variably sets the internal ratio of the timing difference between the two signals to 0/MD, MF/MD, 2MF/MD, 3MF/MD, . . . , and a dividing value Na11=N+MF/MD is obtained. In FIG. 3, frequency division N is given as N=P×A+B where the frequency-divided output of the prescaler 107 is assumed to be P/P+1, and A and B are frequency divisions performed by the A and B counters, FIG. 4 illustrates the arrangement and signal line connection relationship of the interpolator 100, timing control circuit 115, timing/power control signal generator 116 and 32/33 prescaler 107 in the embodiment of the invention shown in FIG. 3.

Figure 4:
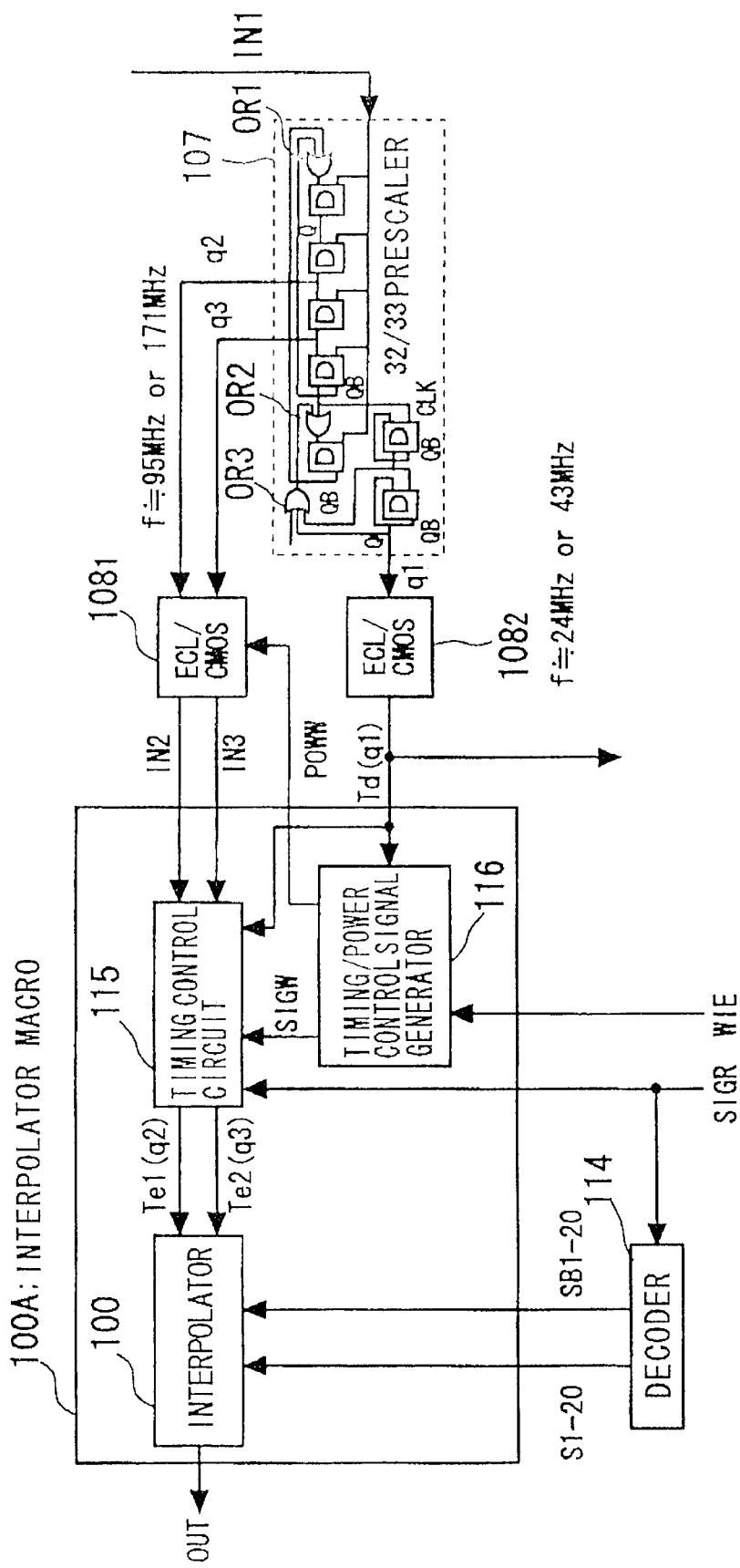
FIG. 4 is a diagram illustrating the connection relationship among signals of the first embodiment.
Figures 5A, 5B:
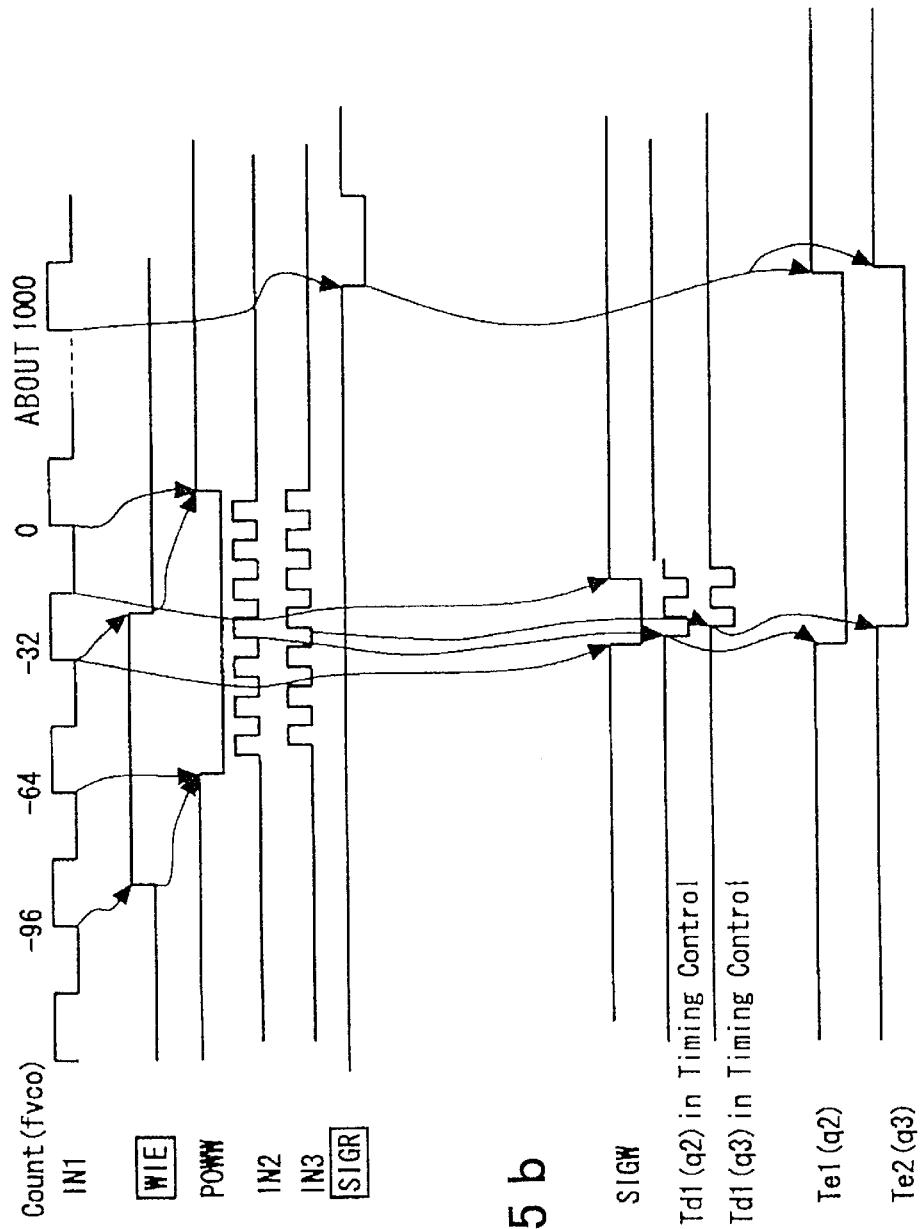
FIG. 5 is a timing diagram useful in describing the operation of the first embodiment.

FIGS. 5a and 5b illustrate examples of the timing waveforms of a clock IN1 (input to the prescaler) in FIG. 4, IN2, IN3, which are outputs of the ECL/CMOS circuit $108_1$, control signals WIE, SIGW, POWW, SIGR, and inputs Te1 (q2), Te2 (q3) of the interpolator 100. In other words, FIG. 5a and 5b show the timings of the inputs to and outputs from the timing control circuit 115.

Upon receiving the output of the A counter 109 in FIG. 3, the control circuit 113 outputs the WIE signal to the timing/power control signal generator 116 as an active signal at a "−96" clock (96 clocks ago, with 0 serving as the reference). Upon receiving this signal, the timing/power control signal generator 116 activates (sends to the low level) the power control signal POWW to thereby activate the ECL/CMOS circuit $108_1$, which has been in the inactive state thus far, so that the timing control circuit 115 is supplied with the signals IN2, IN3 (which differ in phase by one clock cycle), which are 1/8 frequency-divided clocks (frequency f=95 MHz or 171 MHz) of the prescaler 107. The timing control circuit 115 opens a gate during a time that the gate signal SIGW is active (for an interval of 16 clocks in FIG. 5). During this period of time, falling edges of the signals IN2, IN3 that are input to the timing control circuit 115 from the prescaler 107 via the ECL/CMOS circuit $108_1$ are supplied to the interpolator 100 as Te1, Te2, respectively.

At the 0th clock, the POWW signal is deactivated (placed at the High level) to deactivate the ECL/CMOS circuit $108_1$. At about 1000 clocks, the control circuit 113 deactivates (sets to the High level) the control signal SIGR supplied to the timing control circuit 115. Upon receiving this signal, the timing control circuit 115 sets the signals Te1, Te2, which have been at the Low level, to the High level after the transition from High to Low.

As shown in FIG. 4, the 32/33 prescaler 107 is composed of D-type flip-flops connected in five stages (the first to fourth flip-flops are indicated by D in FIG. 4). The output of a first OR gate OR1 is connected to the data input terminal of the initial stage of the D-type flip-flops; a non-inverting Output terminal Q of the D-type flip-flop of the fourth stage is input to one input terminal of a second OR gate OR2; an inverting terminal output Q of the D-type flip-flop of the fourth stage is input to one input terminal of the OR gate OR1; the output terminal of the second OR gate OR2 is input to the data input terminal of the D-type flip-flop of the fifth stage; the output (IN1) of the VCO is input commonly to the clock input terminals of the first to fifth flip-flops; and the output terminal of the flip-flop of the fifth stage is input to the second input terminal of the first OR gate OR1. The output terminal of the flip-flop of the fifth stage is input to the second input terminal of the first OR gate OR1. The output terminal of the flip-flop of the fourth stage is connected to the clock input terminal of a sixth D-type flip-flop to the data input terminal of which the inverting output terminal QB is fed back; the non-inverting, output terminal Q of the sixth D-type flip-flop is connected to the clock input terminal of a seventh D-type flip-flop to the data input terminal of which the inverting output terminal QB is fed back; the output q1 from the output terminal of the seventh flip-flop is input to an ECL/CMOS circuit $108_2$ and to a third OR gate OR3 together With the output of the sixth flip-flop and the signal MC; and the output of the third OR gate OR3 is input to the second OR gate OR2.

With reference again to FIG. 3, the interpolator 100 has a NAND gate NAND 1, to which two clocks of mutually different phases are input as first and second input signals, for outputting the result of a prescribed logic operation between the first and second input signals; a first P-channel MOS transistor MP1, which is connected between a power supply VDD and an internal node and to a gate terminal whereof an output signal from the NAND1 is input, for being turned on when both the first and second input signals are at a high level to thereby form a path for charging a capacitor at the internal node; and an inverter IV3, which is an inverting buffer, having the internal node connected to an input terminal thereof for changing an output logic value if a magnitude relationship between the terminal voltage of the capacitor of the internal node and a threshold value has been inverted. Provided between the internal node and ground are serially connected an N-channel MOS transistor MN1 and a circuitry which is comprised of N-channel MOS transistors MN21, MN22, connected in parallel. To the gate terminal of the N-channel MOS transistor MN1 is input a signal obtained by inverting tile first input signal by the inverter INV1 so that when the first input signal is at Low level, the transistor MN1 turns ON. To gate terminals of N-channel MOS transistors MN11, MN12, are connected the control signals from the decoder 114 so that these transistors are turned on or off. Provided between the internal node and ground are serially connected an N-channel MOS transistor MN2 and a circuitry which is comprised of N-channel MOS transistors MN21, MN22, connected in parallel. To the gate terminal of the N-channel MOS transistor MN2 is input a signal obtained by inverting the second input signal by the inverter INV2 so that when the second input signal is at Low level, the transistor MN2 turns ON. To gate terminals of N-channel MOS transistors MN21, MN22, are connected the control signals from the decoder 114 so that these transistors arc turned on or off.

Figure 6:
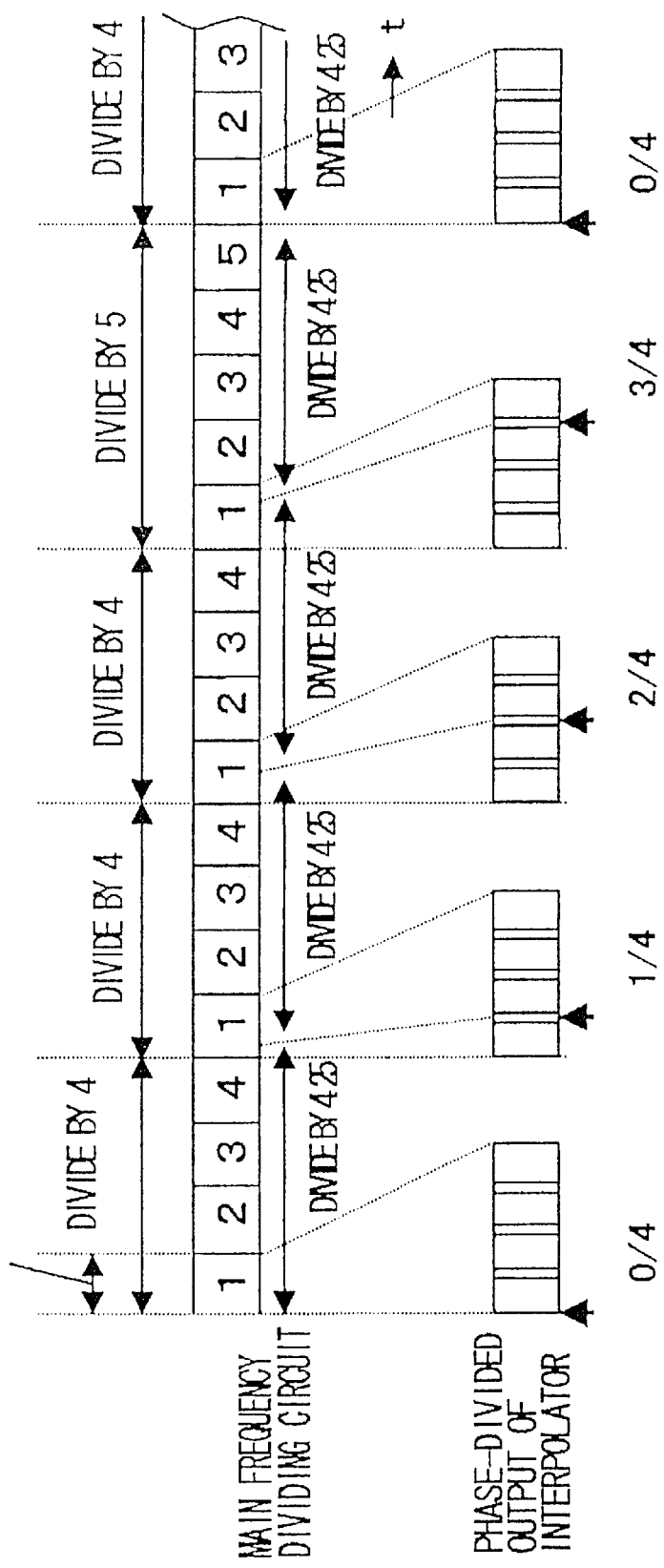
FIG. 6 is a diagram useful in describing the operation of the first embodiment.

The principle of operation of this embodiment of the present invention will now be described with reference to FIG. 6. FIG. 6 is a diagram for describing the operating principle in a case where the dividing ratio has been made 4.25 (integral dividing ratio 4+fractional dividing ratio 1/4) for the sake of simplicity.

The main frequency dividing circuitry (15 in FIG. 1 and 107, 109, 110 in FIG. 3) divides the output of the voltage-controlled oscillator 106 by 4 and divides to 1/4 a timing difference between the initial frequency-divided clock of the second divide-by-4 operation and a clock delayed by a clock cycle tCK (the period of the output clock of the VCO) from this frequency-divided clock, whereby a 4.25-divided first cycle (4.25−0=4.25) is realized. The main frequency dividing circuitry then divides a timing difference of the clock cycle tCK relative to the initial clock of the next divide-by-four operation to 2/4 to thereby realize a 4.25-divided second cycle (8.5−4.25=4.25). Divide-by-5 is performed in the next cycle so that a timing difference of the clock cycle tCK relative to the 5-divided initial clock is divided to 3/4, whereby a 4.25-divided third cycle (12.75−8.50=4.25) is realized. The main frequency dividing circuitry then divides a timing difference of the clock cycle tCK relative to the initial clock of the next divide-by-four operation to 0/4 to thereby realize a 4.25-divided fourth cycle (17−12.75=4.25).

Figure 7:
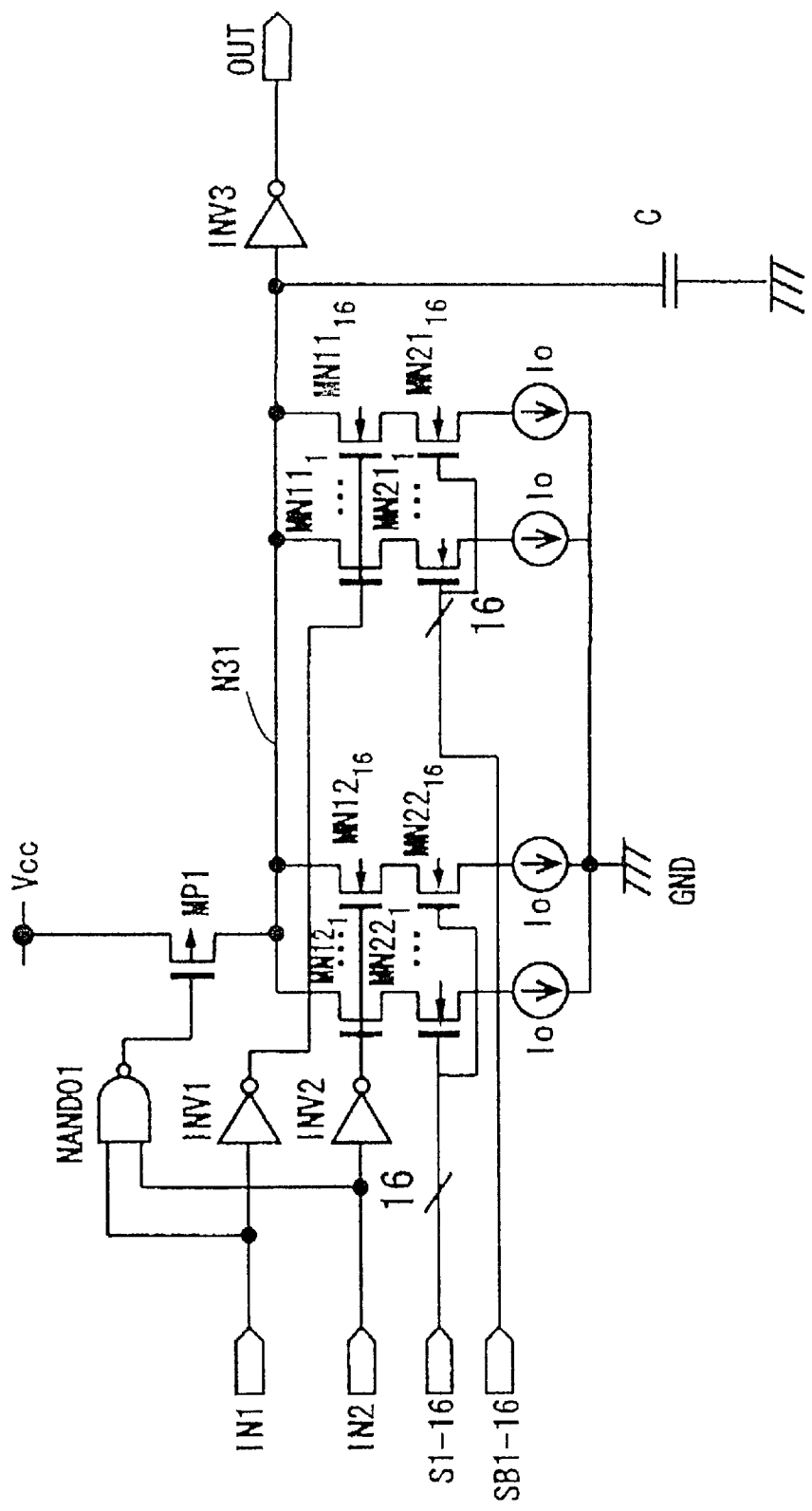
FIG. 7 is a diagram showing an example of the circuitry of an interpolator.

FIG. 7 is a diagram showing an example of the structure of the interpolator 100 according to the embodiment of the invention shown in FIG. 3. As shown in FIG. 7, the interpolator comprises a P-channel MOS transistor MP1 having its source connected to a power supply Vcc and its drain to an internal node N31 and to the gate of which is input the output signal of a NAND gate NAND01 to which the first and second input signals IN1, IN2 are supplied; an inverter INV3 for switching the logic value of the output signal when a magnitude relationship between the voltage level at the internal node and a threshold-value voltage changes; inverters INV1, INV2 the input terminals of which are connected to the input signals IN1, IN2, respectively; 16 N-channel MOS transistors $MN11_1$, to $MN11_{16}$ the drains of which are connected in common with the internal node N31 and the gates of which are connected to the output of the inverter INV1; 16 N-channel MOS transistors $MN12_1$ to $MN12_{16}$ the drains of which are connected in common with the internal node N31 and the gates of which are connected to the output of the inverter INV2; 16 N-channel MOS transistors (switch elements) $MN21_1$ to $MN21_{16}$ the drains of which are connected to the sources of the N-channel MOS transistors $MN11_1$ to $MN11_{16}$, respectively, the sources of which are connected to respective ones of constant-current sources $I_0$ and the gate terminals of which are connected to a weighting signal SB1–16 (complementary signal of S1–16) from the decoder 114 so as to be turned on and off; and 16 N-channel MOS transistors (switch elements) $MN22_1$ to $MN22_{16}$ the drains of which are connected to the sources of the N-channel MOS transistors $MN12_1$ to $MN12_{16}$, respectively, the sources of which are connected to respective ones of constant-current sources $I_0$ and the gate terminals of which are connected to a weighting signal S1–16 from the decoder 114 so as to be turned on and off.

Further, a capacitor C is connected between the internal node 31 and ground (GND).

The operation of internally dividing a timing difference will be described for a case where N-number of the 16 parallel-connected N-channel MOS transistors are turned on by the input signal IN1 (where N is 0 to 16, N=0 means that no transistors turn on and N is decided by a control signal C), and (16−N)-number of the N-channel MOS transistors are turned on by the input signal IN2 after a time T, so that a total of N+(16−N)=16 N-channel MOS transistors are turned on.

Let the current that flows into one of the parallel N-channel NIOS transistors be I (the current value of the constant-current source I0), let the threshold voltage at which the output of the inverter INV3 is inverted be V, and let CV represent the amount of variation in electric charge up to the threshold-value voltage V.

Assume that the input signals IN1, IN2 are both at High level, that the output of the NAND gate NAND01 is at Low level and that the internal node N31 is in a state in which it has been charged from the power-supply side via the P-channel MOS transistor MP1. An instance where the input signals IN1, IN2 fall to Low level under these conditions will now be described.

First, at N=16, 16 of the 16 parallel N-channel MOS transistors $MN11_1$ to $MN11_{16}$ are turned on by the input signal IN1, then, after the time T, all of the 16 parallel N-channel MOS transistors MN12, to $MN12_{16}$ are turned off by the input signal IN2 [(IN−16)=0]. Accordingly, if N=16 holds, with I as the current of the constant-current sources $I_0$, the time T(16) from the moment the input signal IN1 falls to the Low level to the moment the output of the inverter INV3 is inverted is as follows:

$$T(16)=CV/(16 \cdot I) \tag{1}$$

If N=n (n<16) holds (N is set by the control signal C), n-number of N-channel MOS transistors to the gates of which the inverted signal of the input signal IN1 is applied turn on for the time T (where T is the timing difference between falling edges of the input signals IN1 and IN2) after the input signal IN1 falls to Low level, as a result of which an electric charge equivalent to n·I·T is discharged. Next, in response to the input signal IN2 falling to Low level, (16−n)-number of N-channel MOS transistors to the gates of which the inverted signal of the input signal IN2 is applied turn on. Hence, a total of 16 N-channel MOS transistors turn on and the output of the inverter INV3 is inverted (changes from the high level to the low level) at the moment (time T') the electric charge (CV−n·I·T) that remains at the internal node N31 is discharged by 16·I.

The time T' is given by the following:

$$(CV-n \cdot I \cdot T)/(16 \cdot I)$$

Accordingly, the time T(n) from the moment the input signal IN1 falls to the Low level to the moment the output of the inverter INV3 is given by the following:

$$T(n) = (CV - n \cdot I \cdot T)/(16 \cdot I) + T \tag{2}$$
$$= CV/(16 \cdot I) - (n/16)T + T$$
$$= T(16) + (16 - n)/16 \cdot T$$

Depending upon the value of n, there is obtained an output signal having a phase obtained by equally dividing the timing difference T between the input signals IN1 and IN2 by 16. More specifically, by setting a weighting signal and varying n, there is obtained an output signal of any phase obtained by dividing the timing difference between the input signals IN1 and IN2 at a resolution of 1/16. Such an interpolator is referred to as a "16-step interpolator". In general, when an interpolator is an M-step (where M is any positive integer) interpolator, M-number of each of the N-channel MOS transistors MN11, MN12, MN21, MN22 are disposed in parallel.

Two signals between which a timing difference is one clock cycle tCK, for example, are applied to the inputs IN1, IN2 of the interpolator, and timing differences of 0, tCK/16, 2tCK/16, . . . are obtained from the input IN1 every input clock, whereby there can be produced a signal having a clock cycle of tCK(1+1/16).

It should be noted that a 16-step interpolator can be constructed by always turning off N-channel MOS transistors $MN21_{17}$ to $MN21_{20}$ and $MN22_{17}$ to $MN22_{20}$ among 20 parallel N-channel MOS transistors $MN21_1$ to $MN21_{20}$ and $MN22_1$ to $MN22_{20}$.

The capacitor C shown in FIG. 7, may be substituted by an arrangement in which a plurality of series circuits, each of which comprises a switch element constituted by an N-channel MOS transistor and a capacitor, are connected in parallel between the internal node N31 and ground, and the switch elements are turned on and off based upon a control signal supplied to the control terminals of the switch elements, whereby a capacitance C connected to the internal node N31 is set in a programmable manner.

The interpolator shown in FIG. 7 is such that the internal node N31 is charged to the power-supply potential when the input signals IN1, IN2 are both at High level. When the input signals IN1, IN2 make a negative-going transition from High to Low level, the internal node N31 is discharged and the output signal rises from the low to the high level. However, an arrangement may be adopted in which the output signal rises from the low to the high level in response to a positive-going transition of the input signals from the low to the high level. In order to obtain logic in which the output signal falls from the high to the low level in response to a negative-going transition of the input signals IN1, IN2 from the high to the low level, the inverter INV3, which is an inverting buffer, should be made a non-inverting buffer.

Figure 8:
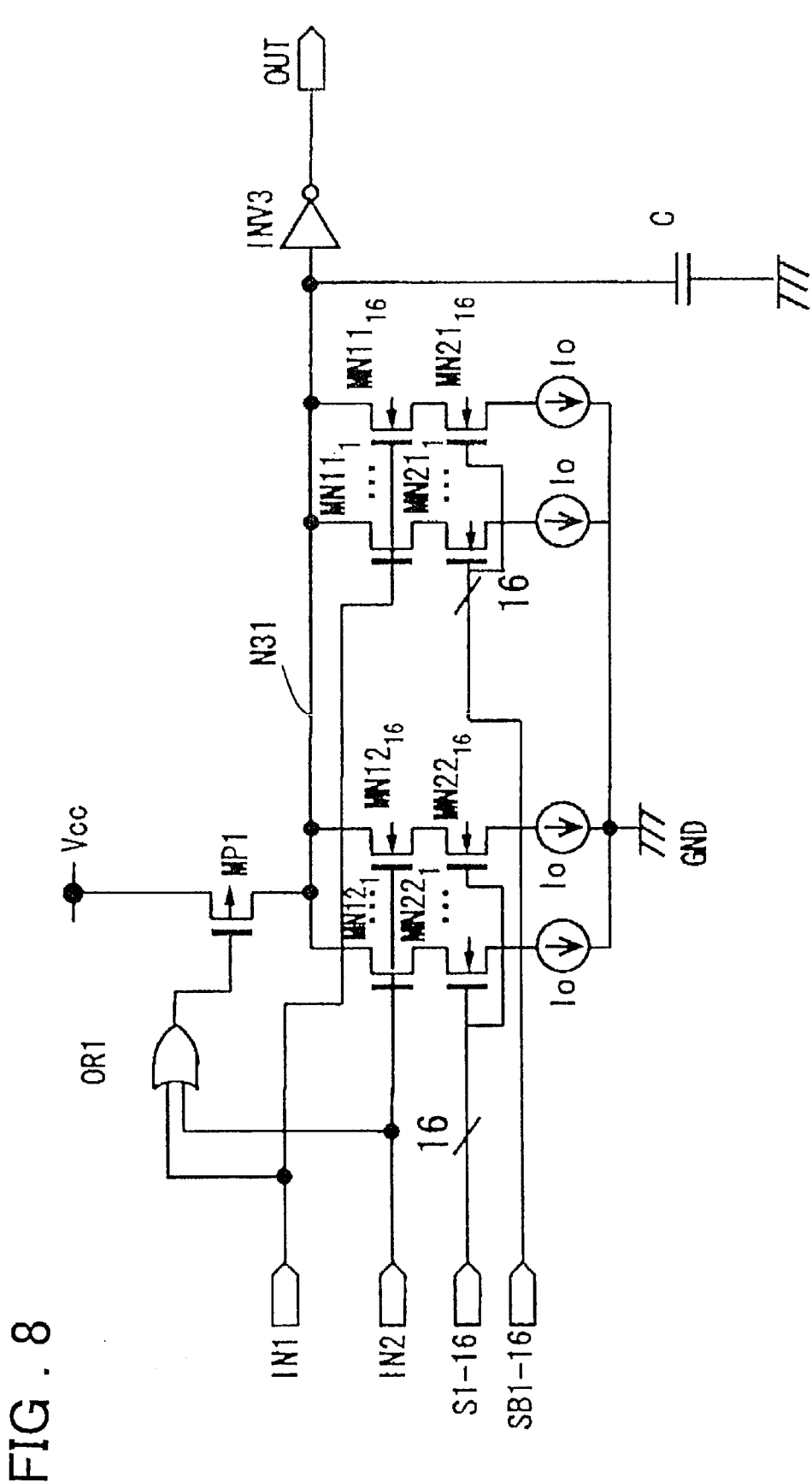
FIG. 8 is a diagram showing another example of the circuitry of an interpolator.

FIG. 8 illustrates an example of the circuitry of the interpolator 100 for outputting a rising signal upon dividing the timing difference between edges making a positive-going transition from the low to the high level of input signals. As shown in FIG. 8, the interpolator comprises the P-channel MOS transistor MP1 having its source connected to the power supply Vcc and its drain to the internal node N31 and to the gate of which is input the Output signal of an OR gate OR1 to which the first and second input signals IN1, IN2 are applied; an inverter INV3 for switching the logic value of the output signal when the size relationship between the potential at the internal node and a threshold-value voltage changes; 16 N-channel MOS transistors $MN1_1$ to $MN11_{16}$ the drains of which are connected in common with the internal node N31 and the gates of which are connected in common with the input signal IN1; 16 N-channel MOS transistors $MN12_1$ to $MN12_1$ the drains of which are connected in common with the internal node N31 and the gates of which are connected in common with the input signal IN2; 16 N-channel MOS transistors (switch elements) $MN21_1$ to $MN21_{16}$ the drains of which are connected to the sources of the N-channel MOS transistors $MN11_1$ to $MN11_{16}$, respectively, the sources of which are connected to respective ones of constant-current sources $I_0$ and the gate terminals of which are connected to the weighting signal SB1–16 (complementary signal of S1–16) from the decoder 114 so as to be turned on and off; and 16 N-channel MOS transistors (switch elements) $MN22_1$ to $MN22_{16}$ the drains of which are connected to the sources of the N-channel MOS transistors $MN12_1$ to $MN12_{16}$, respectively, the sources of which are connected to respective ones of constant-current sources $I_0$ and the gate terminals of which are connected to the weighting signal S1–16 from the decoder 114 so as to be turned on and off.

The capacitor C shown in FIG. 8, may be substituted by an arrangement in which a plurality of series circuits, each of which comprises a switch element constituted by an N-channel MOS transistor and a capacitor, are connected in parallel between the internal node N31 and ground, and the switch elements are turned on and off based upon a control signal supplied to the control terminals of the switch elements, whereby a capacitance C applied to the internal node N31 is set by a program.

In the arrangements of FIGS. 7 and 8, the positions of the N-channel MOS transistors MN11, MN12 and of the N-channel MOS transistors MN12, MN22 may be reversed. Further the weighting signal SB1–16 may be a signal obtained by inverting the signal S1–16 using an inverter. More specifically, the interpolators shown in FIGS. 7, and 8 may be preferably configured in such a structure wherein drains of the transistors $MN22_1$ to $MN22_{16}$ of which gates are connected to the selection signals S1–16 are connected respectively to the node N31, and drains of the transistors $MN12_1$ to $MN12_{16}$ of which gates are connected to the output terminal of the inverter INV2 are connected respectively to sources of the transistors $MN22_1$ to $MN22_{16}$ while sources of the transistors $MN12_1$ to $MN12_{16}$ are connected respectively to corresponding current sources I0, and wherein drains of the transistors $MN21_1$ to $MN21_{16}$ of which gates are connected respectively to the selection signals SB1–16 are connected to the node N31, and drains of the transistors $MN11_1$ to $MN11_{16}$ of which gates are connected to the output of the inverter INV1 are connected respectively to sources of the transistors $MN21_1$ to $MN21_{16}$, while sources of the transistors $MN11_1$ to $MN11_{16}$ are connected respectively to corresponding current sources I0.

Figure 9:
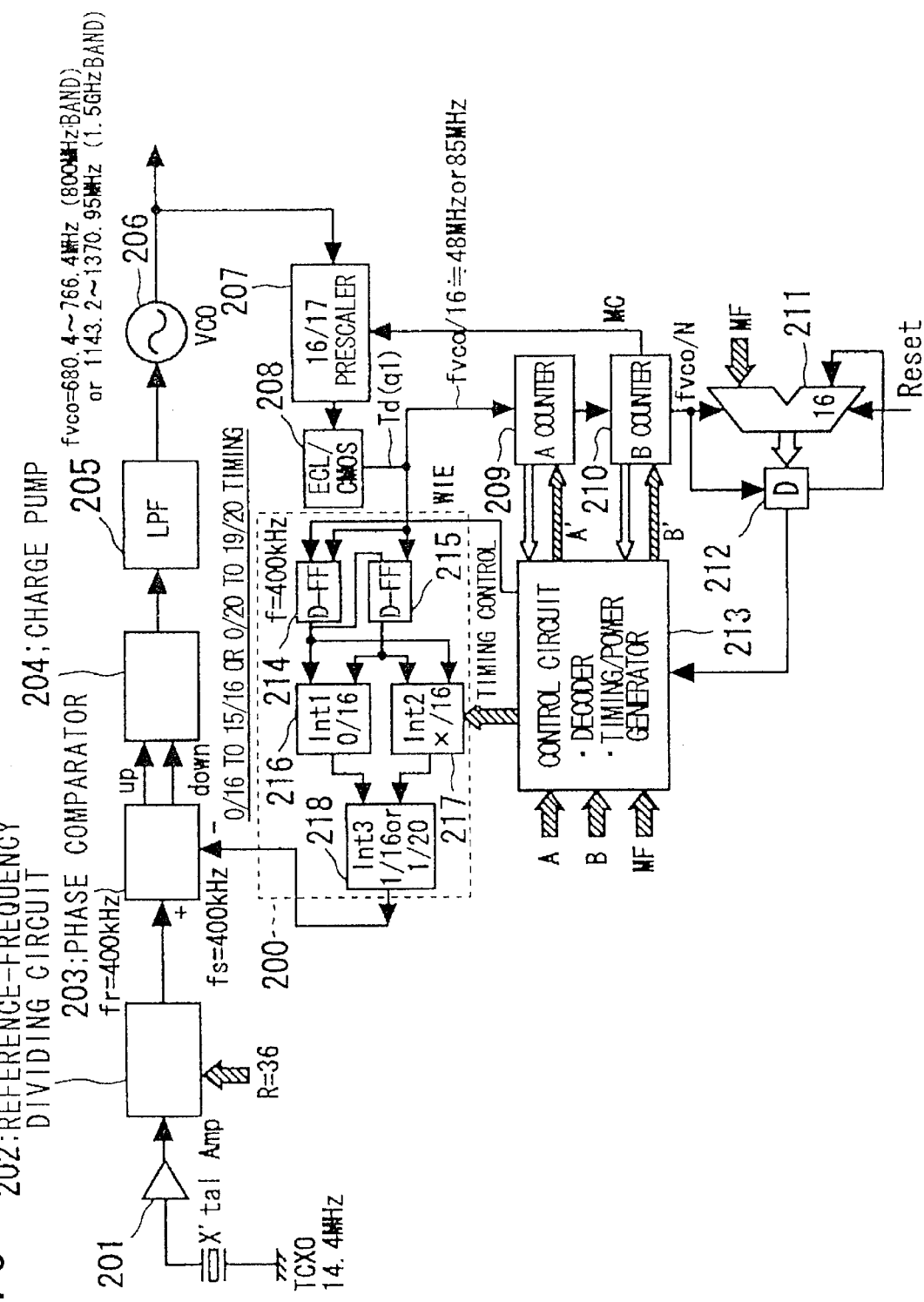
FIG. 9 is a block diagram illustrating the structure of the second embodiment.
Figure 10:
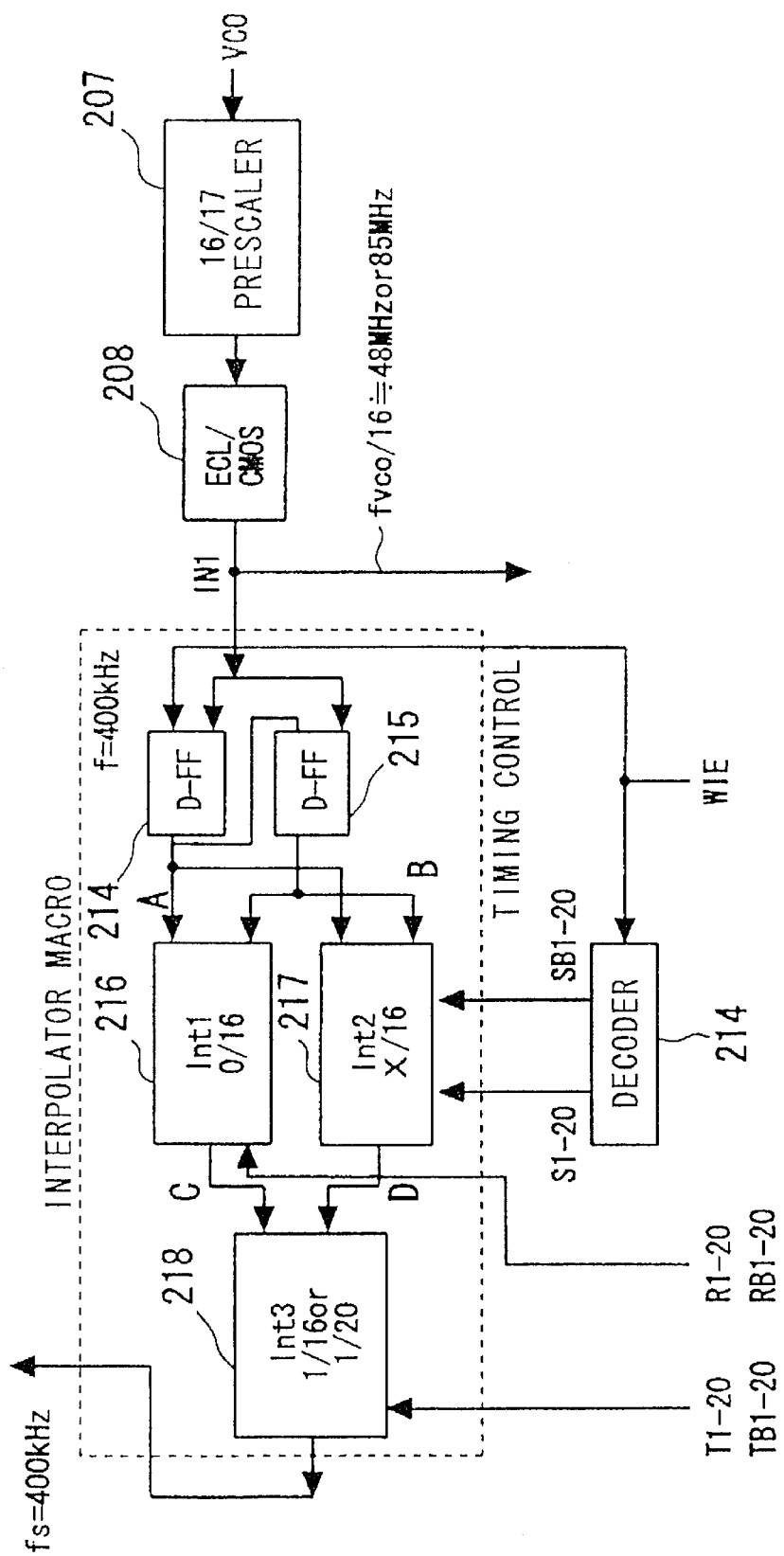
FIG. 10 is a diagram illustrating the connection relationship among signals of a second embodiment of the present invention.
Figure 11:
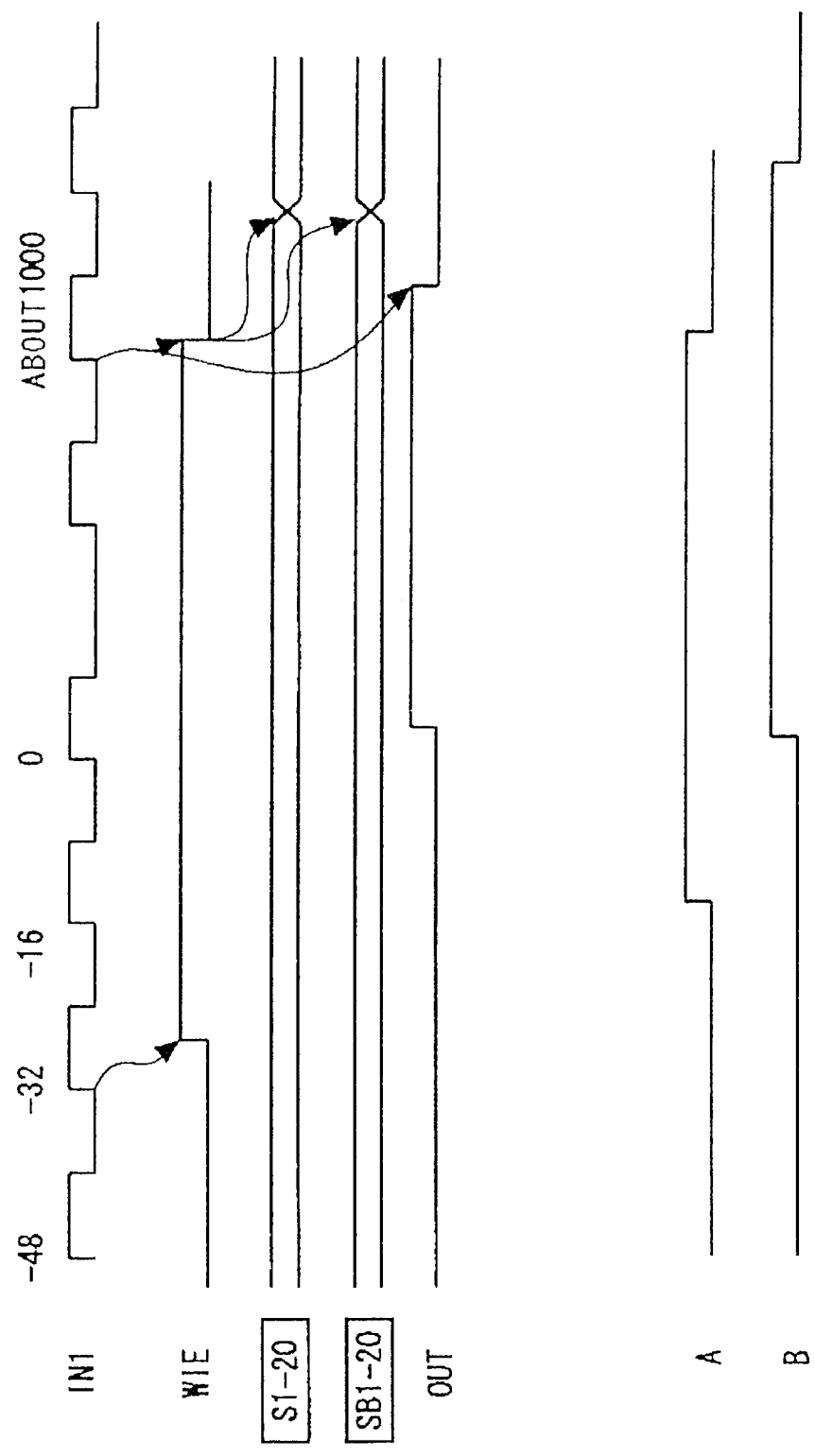
FIG. 11 is a timing diagram useful in describing the operation of the second embodiment.

FIG. 9 illustrates a structure of a second embodiment of the present invention, FIG. 10 is a diagram illustrating the connections to the interpolator portion of FIG. 9, and FIG. 11 is a diagram illustrating the timing waveforms on principal signals.

As shown in FIG. 9, the second embodiment of the invention has an interpolator 200 comprising 16-step first and second interpolators 216, 217 and a third interpolator 218 the inputs to which are the outputs of the first and second interpolators.

This embodiment includes a 16/17 prescaler 207 for frequency-dividing the output of a voltage-controlled oscillator 206. A signal obtained by converting a 16/17-divided output of the prescaler 207 to the CMOS level using an ECL/CMOS converter circuit 208 is input to an A counter 209 and to the clock input terminals of D-type flip-flops 214, 215. It should be noted that since the 16/17 prescaler 207, A counter 209, a B counter 210, an adder 211 and a register 212 operate in the same manner as the 32/33 prescaler 107, A counter 109, B counter 110, adder 111 and register 112 of FIG. 3, these need not be described again.

The signal WIE from a control circuit 213 is connected to the data input terminal of the D-type flip-flop 214 and the data output terminal of the D-type flip-flop 214 is connected to one clock input terminal of each of the first and second interpolators 216, 217 and to the data input terminal of the D-type flip-flop 215. The data Output terminal of the D-type flip-flop 215 is connected to the other clock-input terminal of each of the first and second interpolators 216, 217.

Signals R1–20, RB1–20 are fed to the first interpolator 216 as weighting signals that decide the interior division ratio of the timing difference. Here the internal ratio is fixed at 0/16.

Signals S1–20, SB1–20 (SB1–20 are the complementary signals of S1–20) are fed to the second interpolator 217 as weighting signals that decide the internal ratio of the timing difference. Here the internal ratio (X/16) is set variably.

Signals T1–20, TB1–20 (TB1–20 are the complementary signal of T1–20) are fed to the third interpolator 218 as control signals. The internal ratio is fixed at 1/16 or 2/20.

The interpolators 216, 217, 218 have a structure similar to that of FIGS. 7, 8, etc. As for the interior division ratio 1/16 of a timing difference, 20 N-channel MOS transistors are provided in parallel with N-channel MOS transistors $MN21_1$ to $MN21_{20}$, $MN11_1$ to $MN11_{20}$, $MN12_1$ to $MN12_{20}$ and $MN22_1$ to $MN22_{20}$ FIG. 7 and, by turning four of these off, an interpolator having a 16-step resolution can be achieved.

In a case where a timing difference (tCK) of the two input clocks is divided at X/16 by the second interpolator 217 and the timing difference (tCK) of the two input clocks is divided at 0/16 by the first interpolator 216, X/16−0/16=X/16 of the timing difference tCK is further divided at 1/16 or 1/20 and output (X/256, X/320) by the third interpolator 218 to which the outputs of the interpolators 216, 217 are input, thereby making it possible to improve timing accuracy.

As shown in FIG. 11, the control circuit 213 activates the signal WIE at a −32 clock and deactivates the signal at about 1000. The first and second interpolators output a signal OUT having a delay time obtained by dividing the timing difference between the inputs A and B (the timing difference being a period generated by D-type flip-flops 214, 215 and frequency-divided by the 16/17 prescaler 207).

Figure 12:
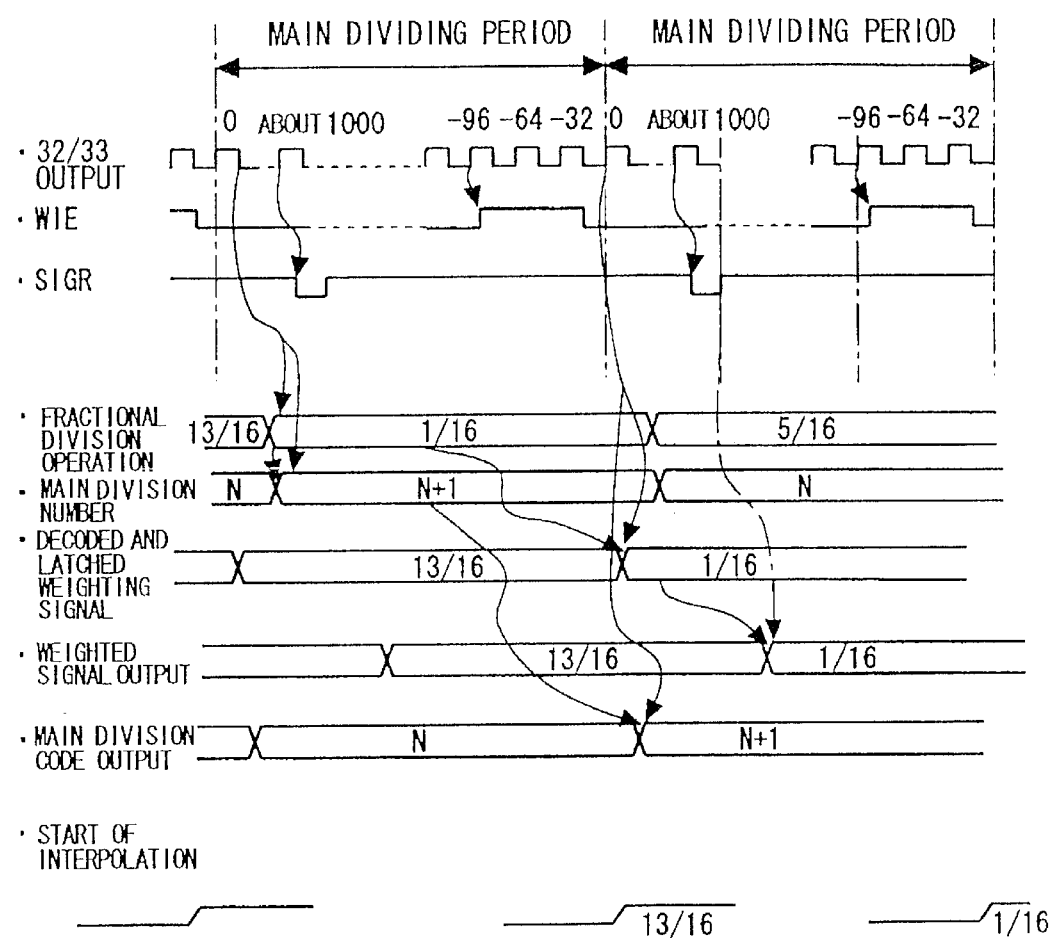
FIG. 12 is a diagram illustrating an example of timing for setting the weighting signal of an interpolator in the second embodiment.
Figure 13:
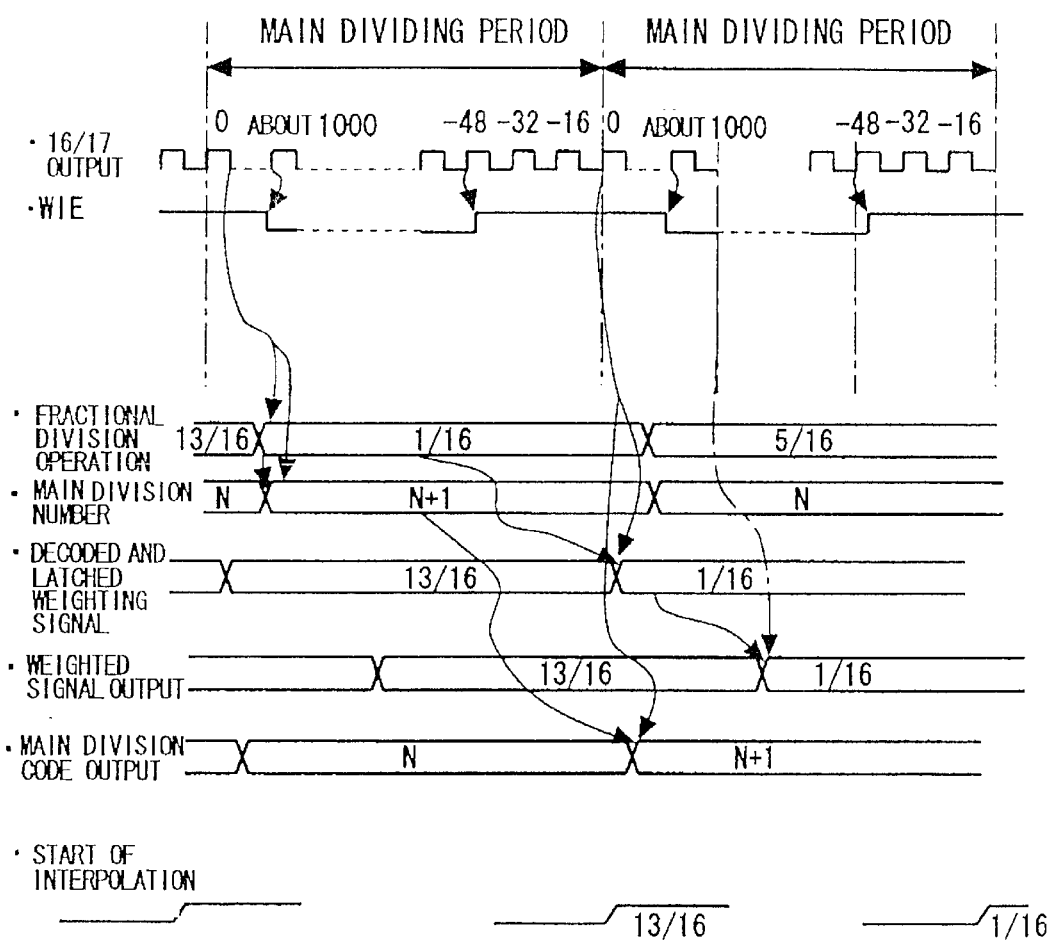
FIG. 13 is a diagram illustrating an example of timing for setting the weighting of an interpolator in the second embodiment.

Described next will be the timing at which the interior division ratio of the timing difference is variably set in the interpolator. FIGS. 12 and 13 are diagrams useful in describing the setting timing of the weighting signal from the decoders 114, 214 applied to the interpolators 100, 200 [namely the signal which sets a dividing value (interior division ratio) of the timing difference in the interpolator] in the first and second embodiments of the present invention. The changing over of the weighting signal to the interpolators 100, 20 is performed when the interpolator is not operating.

In a case where the numerator MF×m is equal to or greater than the denominator MD in the weighting signal applied to the interpolator, the increment (+1) of the dividing ratio in the frequency dividing circuit becomes the cycle (integral frequency dividing period) before one-cycle changeover of the interpolator. The control signal MC and weighting signal of the prescalers 107, 207, therefore, are sets to the previous integral frequency dividing interval.

Referring now to FIG. 12 and FIG. 3, from the result 13/16 of fractional frequency division performed by the adder 111, the value obtained by adding MF=4 to the numeral 13 is 17 with the control circuit 113. Consequently, in the next integral frequency dividing (referred to as the "main dividing period"), the integral division number (referred to as the "main division number") changes from N to N+1 (from 1800 to 1801 in the example of FIG. 1), the numerator is made 1, which is the remainder when 17 is divided by 16, and the weighting signal is 1/16.

In the initial main dividing period, the weighting signal 13/16 supplied from the control circuit 113 to the decoder 114 and being latched is set in the interpolator 100. At the −32 clock of the 32/33 output of prescaler 106, the interpolator 100 outputs a rising signal whose timing is stipulated by the time at which a timing difference between the two input signals is divided at an internal ratio of 13/16. Then, frequency division by N+1 starts from the 0th clock of the next main division period.

In the next main division period (N+1 division period), the ECL/CMOS circuit 1081 is activated starting from the rising edge of the signal SIGR of about 1000th clock, and the weighting signal 1/16 is set in the interpolator 100 before the timing at which a clock is supplied to the interpolator 100 via the timing control circuit 115 (before the WIE signal attains the high level).

In FIG. 13 also, the weighting signal of the interpolator 200 is set in the previous main division period. In the initial main division period, the weighting signal 13/16 supplied from the control circuit 213 to the decoder 114 and being latched is set in the interpolator 217. At −16 th clock of the 16/17 output of the prescaler 207, the interpolator 200 outputs a rising signal whose timing is stipulated by the time at which the timing difference between the two input signals is divided at the internal ratio of 13/16. Then, frequency division by N+1 starts from 0th clock of the next main division period.

In the next main division period (N+1 division period), the weighting signal 1/16 is set in the interpolator over the time during which the WIE signal is at the low level, namely from the vicinity of about 1000th clock to −48th clock.

Figure 17:
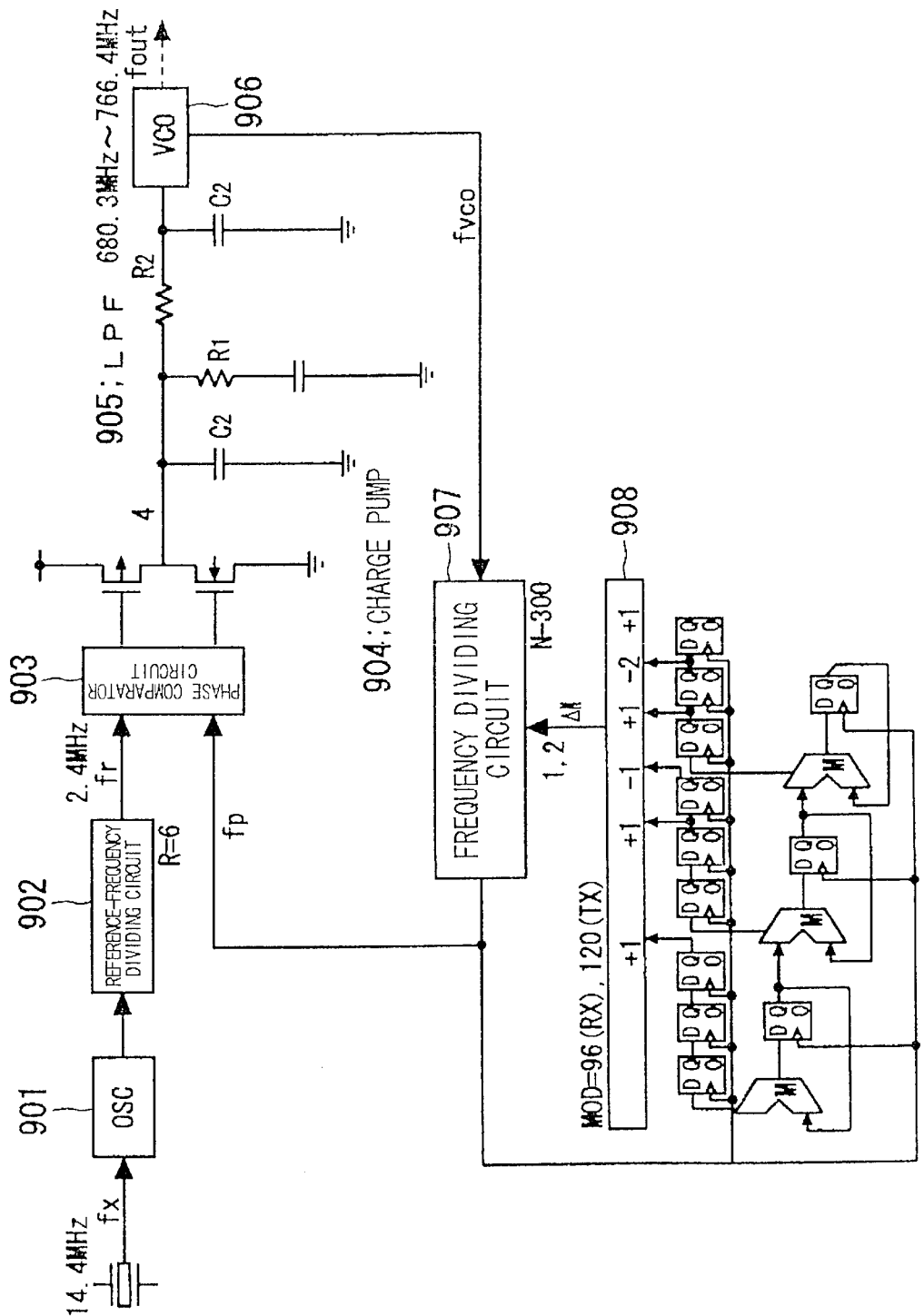
FIG. 17 is a block diagram illustrating the structure of a conventional Delta-Sigma PLL circuit.
Figure 18:
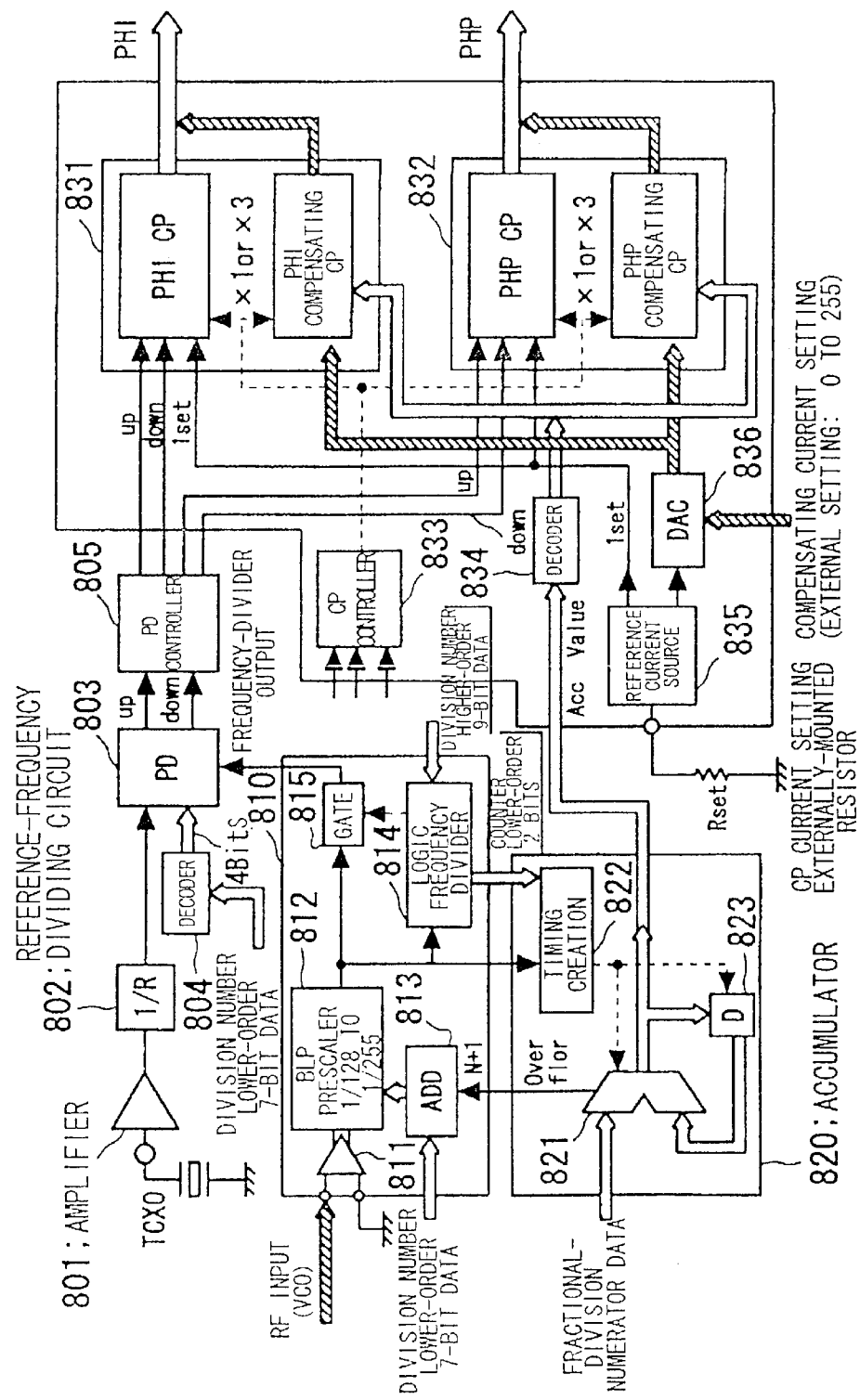
FIG. 18 is a block diagram illustrating an example of the structure of a conventional current-compensated PLL circuit.
Figure 19:
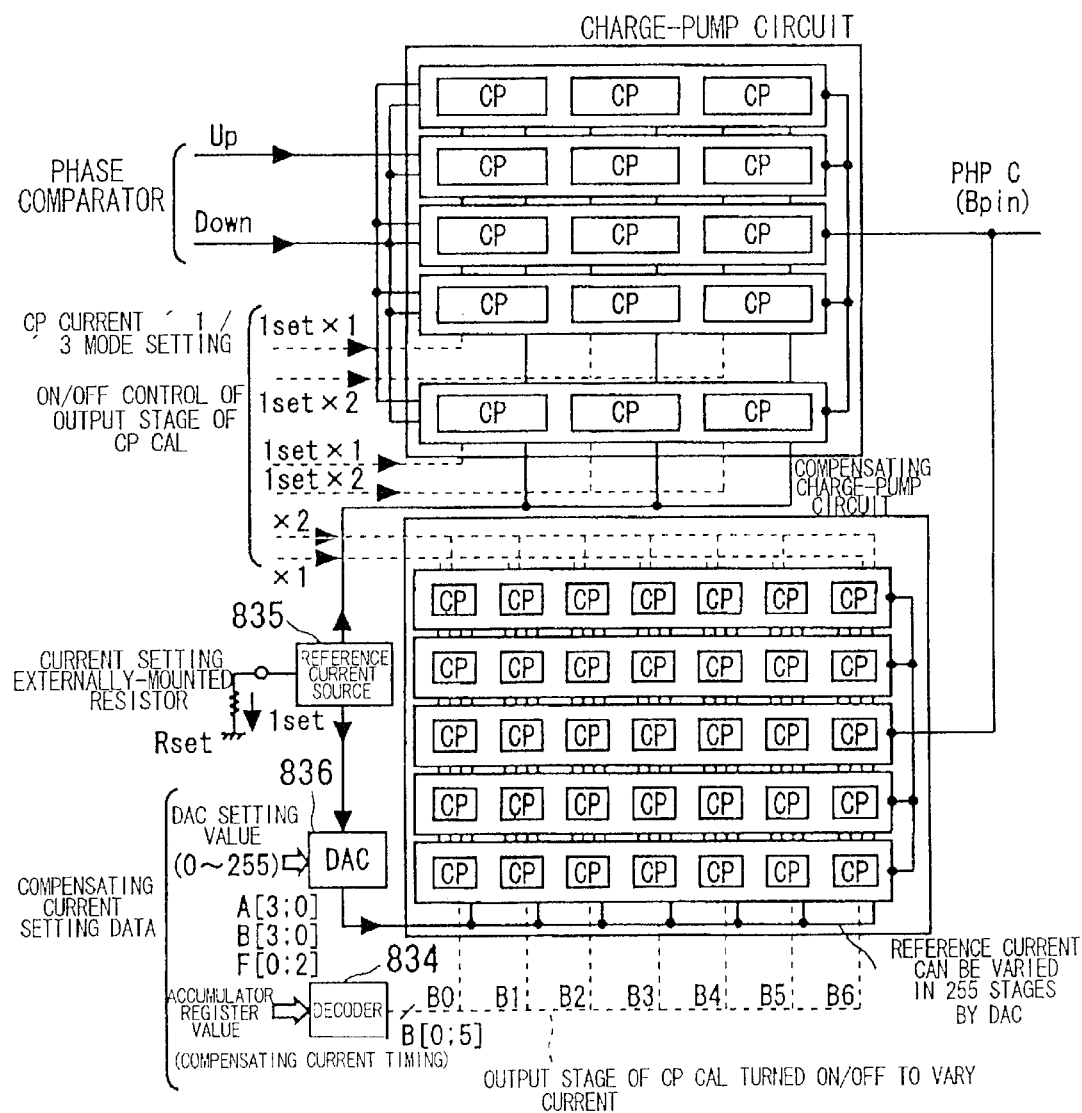
FIG. 19 is a diagram illustrating the details of the structure of a charge pump circuit in the conventional current-compensated PLL circuit shown in FIG. 17.

FIG. 14a is a frequency spectrum of the output of a voltage-controlled oscillator in an uncompensated fractional dividing-type PLL circuit, FIG. 14b is a frequency spectrum of the output of a voltage-controlled oscillator in a PLL circuit according to the embodiment of the invention shown in FIG. 3, FIG. 14c is a frequency spectrum of the output of a voltage-controlled oscillator in the conventional current-compensated PLL circuit shown in FIGS. 18 and 19, and FIG. 14d is a frequency spectrum of the output of a voltage-controlled oscillator in the Delta-Sigma-type PLL circuit shown in FIG. 17. Frequency (in megahertz) and decibels are plotted along horizontal and vertical axes, respectively, of these spectra. It is assumed that the PLL circuit is in the locked state and that the frequency of the voltage-controlled oscillator is 720.025 MHz.

Figure 15:
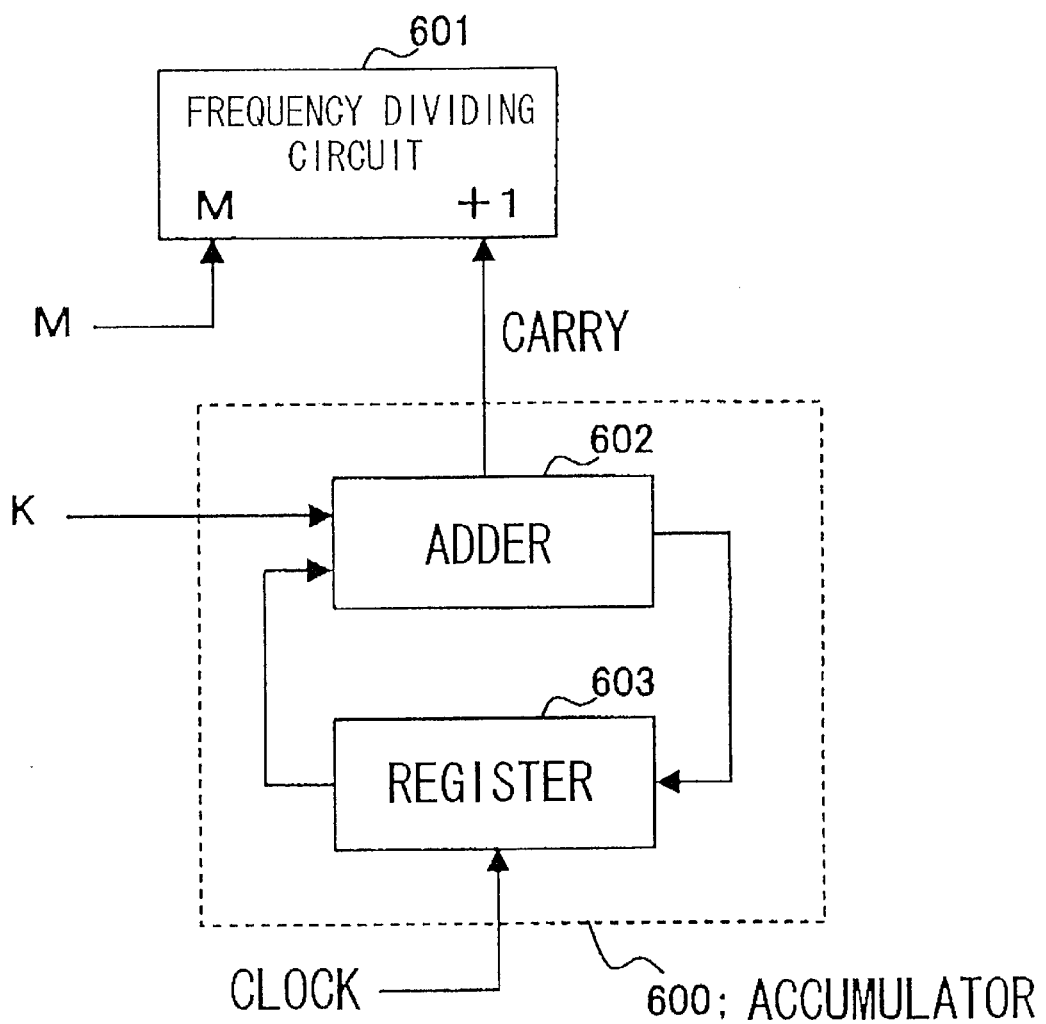
FIG. 15 is a block diagram useful in describing the principle of a frequency dividing circuit in a conventional fractional frequency-dividing PLL circuit.
Figure 16:
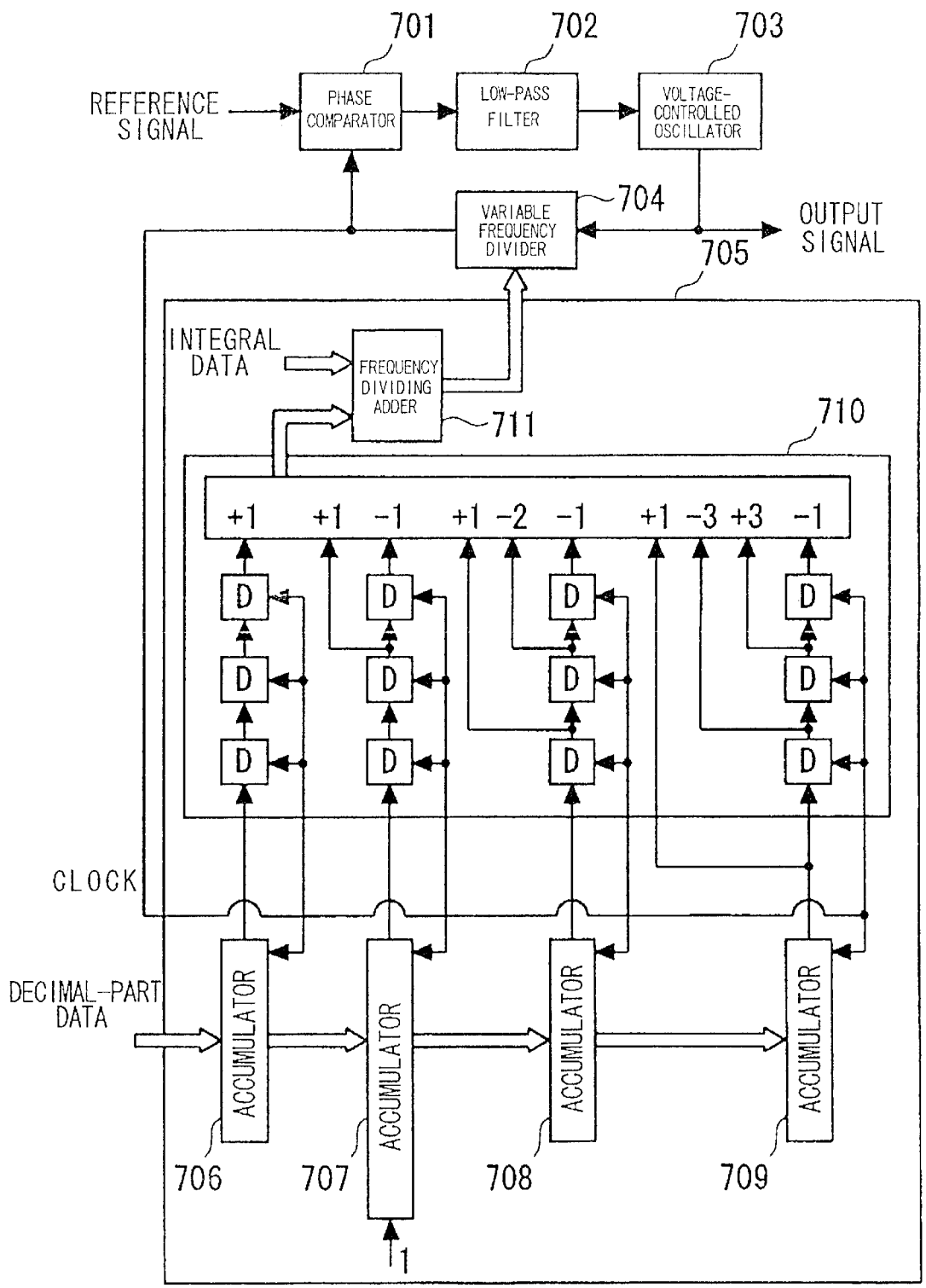
FIG. 16 is a block diagram illustrating an example of the structure of a conventional fractional frequency-dividing PLL circuit.

In the uncompensated fractional dividing-type PLL circuit (see FIG. 15), spurious components (720.025 MHz±m×25 kHz) appear conspicuously every 25 kHz on both sides of the frequency 720.025 MHz of the voltage-controlled oscillator, as shown in FIG. 14a. More specifically, the spurious components are on the order of −13, −30 and −40 dB at m=1, m=2 and m=4, respectively, of the frequency 720.025 MHz±m×25 kHz. The Delta-Sigma method and current-compensated method, which compensate for spurious components, afford an improvement in terms of the spurious components. In the current-compensated method, however, as shown in FIG. 14c, spurious components on the order of −42 and −50 dB appear at m=1 and m=2, respectively, of the frequency 720.025 MHz±m×25 kHz. By contrast, in accordance with the present invention, no spurious components appear, as shown in FIG. 14b.

As many apparently widely different embodiments of the present invention can be made without departing from the spirit and scope thereof, it is to be understood that the invention is not limited to the specific embodiments thereof except as defined in the appended claims.

The meritorious effects of the present invention are summarized as follows.

Thus, in accordance with the present invention, as described above, the structure of a PLL circuit for implementing fractional frequency division is simplified and there is no occurrence of spurious components inevitably produced in the prior art by the conventional fractional frequency division methods.

The reason for this is that the output of the voltage-controlled oscillator is frequency-divided and input to the phase comparator so that the period of the frequency-divided clock compared with the reference signal is rendered a constant fractional dividing value, i.e., so that the frequency is rendered constant.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items might fall under the modifications aforementioned.

What is claimed is:

1. A PLL circuit comprising:
    a phase comparator circuit which receives a reference clock from one input terminal thereof to output a phase difference;
    a charge pump which generates a voltage conforming to the phase difference Output from said phase comparator circuit;
    a loop filter which performs smoothing the voltage conforming to the phase difference;
    a voltage-controlled oscillator which receives an output voltage of said loop filter as a control voltage to output a clock having an oscillation frequency determined by the control voltage;
    a frequency dividing circuit which performs integral frequency-division of an output clock output from said voltage-controlled oscillator;
    a phase adjusting circuit which receives two frequency-divided clocks of mutually different phases obtained by integral frequency division at said frequency dividing circuit to produce an output signal having a delay time defined by a time that is the result of dividing a timing difference between the two frequency-divided clocks in accordance with a prescribed interior division ratio, said interior division ratio being made variable; and
    control means which provides a signal for variably setting, every integral frequency dividing interval, the interior division ratio with which the timing difference is divided in the phase adjusting circuit;
    wherein a frequency-divided clock that is output from said phase adjusting circuit is fed to another input terminal of said phase comparator circuit so that a phase of the frequency-divided clock is compared with that of the reference clock.

2. The PLL circuit as defined in claim 1, wherein the frequency dividing ratio for frequency-dividing the output clock of said voltage-controlled oscillator is N+MF/MD, which is defined by a sum of an integral dividing ratio N and a fractional dividing ratio MF/MD;
    an integral dividing ratio of said frequency dividing circuit is set to either N or N+1; and
    said control means comprises an adder circuit for performing addition cumulatively in units of MF based upon the frequency-divided clock obtained by the integral frequency division;
    said PLL circuit further comprising:
        a control circuit which, if the result of cumulative addition by said adder circuit is equal to or greater than MD, adopts a remainder obtained by dividing said result by MD as a new cumulative result, and which if, the value obtained by adding MF to a present cumulative result, is equal to or greater than MD, sets to N+1 the dividing ratio of said frequency dividing circuit for defining the next integral frequency dividing interval; and
        a decoder circuit which provides, to said phase adjusting circuit, a weighting signal for deciding, based on the cumulative result, an interior division ratio for dividing the timing difference in said phase adjusting circuit;
    where in a clock having at all times a frequency of fvco/(N+MF/MD), which is obtained by dividing a frequency fvco of the output of the voltage-controlled oscillator by the dividing ratio N+MF/MD, being output from said phase adjusting circuit is input to said phase comparator circuit.

3. A PLL circuit comprising:
    a frequency dividing circuit which performs integral frequency-division of an output clock output from a voltage-controlled oscillator;
    a phase adjusting circuit which receives two frequency-divided clock signals of mutually different phases obtained by integral frequency division by said frequency dividing circuit, or two frequency-divided clock signals generated from one clock signal, which has been obtained by integral frequency division by said frequency dividing circuit, having mutually different phases and a period identical with that of said one clock signal, and produces an output signal which includes, as a delay time, a time component that is the result of dividing, in accordance with a prescribed interior division ratio, a timing difference between rising edges or falling edges of the two clock signals input thereto;
    a phase comparator circuit, which receives a reference clock and a frequency-divided clock that is output from said phase adjusting circuit and detects a phase difference between these two clocks;
    a charge pump which generates a voltage conforming to the phase difference detected by said phase comparator circuit;
    a loop filter which provides an output voltage, which is obtained by smoothing the voltage conforming to the phase difference, to said voltage-controlled oscillator as a control voltage;
    an accumulator which performs addition cumulatively in units of MF every integral frequency dividing interval, where MF represents an integer that defines the numerator of a fractional dividing ratio and MD represents an integer that defines the denominator of the fractional dividing ratio;
    a control circuit which, if a value obtained by adding MF to the present cumulative result is equal to or greater than MD, adopts a remainder obtained by dividing this cumulative result by MD as a new cumulative result MF' and changes the integral dividing ratio from N to N+1, and which, if the value obtained by adding MF to the present cumulative result is less than MD, adopts this cumulative result as is, makes the integral dividing ratio equal to N and, on the basis of this cumulative result, generates and outputs a weighting signal for setting the interior division ratio of the timing difference in said phase adjusting circuit; and
    a decoder circuit which decodes the weighting signal from said control circuit and sets the decoded weighting signal to said phase adjusting circuit;
    wherein a clock obtained by frequency-dividing the output of said voltage-controlled oscillator by a value N+MF/MD, which is obtained by adding a fractional dividing ratio MF/MD to the integral dividing ratio N, is input to said phase comparator.

4. The PLL circuit as defined in claim 3, wherein said control circuit comprises at least one counter and
    circuit means which exercises control, on the basis of a count value of said counter, so as to transfer, to the input of said phase adjusting circuit, at every elapse of time of the integral frequency dividing interval, rising edges or falling edges of two clock signals of different phases output from said frequency dividing circuit or of two clock signals of different phases generated from one clock signal obtained by frequency division by said frequency dividing circuit.

5. The PLL circuit as defined in claim 3, wherein said frequency dividing circuit comprises a prescaler having a frequency dividing ratio smaller than the integral dividing ratio N; and said PLL circuit further comprises:
  a counter which counts a frequency-divided output of said prescaler up to a predetermined count value; and
  circuit means which exercises control, on the basis of the count value of said counter, so as to transfer, to the input of said phase adjusting circuit, at every elapse of time of the integral frequency dividing interval, rising edges or falling edges of two clock signals of different phases output from said prescaler or of two clock signals of different phases generated from one clock signal output from said prescaler.

6. The PLL circuit as defined in claim 5, further comprising an accumulator having an adder which, on the basis of an integral frequency-divided signal output from said Counter, adds MF, which is received from one input terminal thereof, to a value at another input terminal thereof, and a register for holding an output from said adder, an output from said register being fed back and applied to said other input terminal of said adder;

wherein said control circuit comprises a first control circuit, to which receives a cumulative result output from said accumulator, for outputting a fractional dividing value decided by the cumulative result and the denominator MD, for generating a timing control signal which is activated for a prescribed interval from a timing corresponding to the integral dividing interval, and for controlling said frequency dividing circuit to set the frequency dividing ratio thereof to N+1 if the cumulative result output from said accumulator is equal to or greater than the denominator MD; and said decoder circuit decodes a fractional dividing value from said first control circuit and provides the decoded value to said phase adjusting circuit as a weighting signal for deciding the internal ratio of the timing difference;

said PLL circuit further comprising a timing control circuit, to which receives a timing control signal from said first control circuit, for performing control on the basis of the timing control signal to transmit the clock output from said frequency dividing circuit to the input of said phase adjusting circuit.

7. The PLL circuit as defined in claim 3, wherein a prescaler is provided as said frequency dividing circuit for frequency-dividing the output of said voltage-controlled oscillator in accordance with a prescribed frequency dividing ratio M or M+1 (where M+1 is an integer smaller than the integral dividing ratio N);

said PLL circuit further comprising:
  a first counter which Counts an M- or (M+1)-frequency-divided output of said prescaler up to a preset count value; and
  a second counter which receives a carry output from said first counter and Counts the (M+1)-frequency-divided output of said prescaler up to the preset count value;

said second counter which outputs a signal having a period obtained by frequency-dividing the output of said voltage-controlled oscillator in accordance with the dividing ratio N or N+1.

8. The PLL circuit according as defined in claim 7, further comprising an accumulator, which comprises an adder and a register, for incrementing MF on the basis of the signal that is output from said second counter;

wherein said control circuit comprises a first control circuit which receives count values from said first and second counters and an output from said accumulator, outputs a fractional dividing value to said decoder as a weighting signal, generates a timing signal conforming to the frequency dividing ratio, and sets the values of said first and second counters to thereby set the integral dividing ratio to N+1 in a next integral frequency dividing interval when the numerator decided by the cumulative result from said accumulator exceeds the denominator of the fractional dividing ratio; and said decoder circuit decodes the weighting signal from said first control circuit and provides the decoded signal to said phase adjusting circuit;

said PLL circuit further comprising a timing control circuit, which receives a timing control signal from said first control circuit and generates a timing control circuit for supplying a signal output from said prescaler to the input of said phase adjusting circuit for a prescribed timing interval from the integral dividing interval.

9. The PLL circuit as defined in claim 8, wherein an ECL/CMOS circuit, which receives the control signal from said first control circuit, for converting an ECL-level signal output from said prescaler to a CMOS level, is activated only for a prescribed timing interval decided by the integral dividing interval, and is deactivated at all other times.

10. The PLL circuit as defined in claim 9, wherein two clock signals output from said prescaler and having between them a timing difference equivalent to the period of the output clock of said voltage-controlled oscillator are input to said ECL/CMOS circuit, and said ECL/CMOS circuit provides signals having two different phases to two respective ones of the input terminals of said phase adjusting circuit.

11. The PLL circuit according to claim 8, further comprising:
  a first D-type flip-flop having a data input terminal for receiving a signal from said ECL/CMOS circuit which receives the output of said prescaler; and
  a second D-type flip-flop having a data input terminal for receiving an output signal from a data output terminal of said first D-type flip-flop;
  clock input terminals of said first and second flip-flops being fed with a timing control signal from said timing control circuit,
  outputs from data output terminals of said first and second flip-flops being provided to respective ones of input terminals of an interpolator of said phase adjusting circuit.

12. A PLL circuit as defined in claim 3, wherein said phase adjusting circuit comprises an interpolator comprising:
  a logic circuit, which receives two clocks of mutually different phases from two input terminals as first and second input signals, for outputting the result of a prescribed logic operation of the first and second input signals;
  a first switch element, which is connected between a first power supply and an internal node and to a control terminal whereof an output signal from said logic circuit is input, for being turned on when both the first and second input signals are at a first value to thereby form a path that charges the internal node;

a buffer circuit of a non-inverting or inverting type having the internal node connected to an input terminal thereof for changing an output logic value if a magnitude relationship between a voltage level at the internal node and a threshold value has been inverted;

a second switch element turned on when the first input signal is at a second value and a group of a plurality of third switch elements, which are connected in parallel with the second switch element between the internal node and a second power supply, for being turned on and off based upon the weighting signal; and a fourth switch clement turned on when the second input signal is at a second value and a group of a plurality of fifth switch elements, which are connected in parallel with the fourth switch clement between the internal node and the second power supply, for being turned on and off based upon the weighting signal.

13. A PLL circuit as defined in claim 3; wherein said phase adjusting circuit includes an interpolator comprising:

a logic circuit, which receives two clocks of mutually different phases from two input terminals as first and second input signals, for outputting the result of a prescribed logic operation of the first and second input signals;

a first switch element, which is connected between a first power supply and an internal node and to a control terminal whereof an output signal from said logic circuit is input, for being turned on when both the first and second input signals are at a first value to thereby form a path that charges the internal node;

a plurality of series circuits, each of which comprises a second switch element turned on when the first input signal is at a second value and a third switch element turned on and off based upon the weighting signal, a plurality of series circuits being connected in parallel between the internal node and a second power supply; and a plurality of series circuits, each of which comprises a fourth switch element turned on when the second input signal is at the second value and a fifth switch element turned on and off based upon the weighting signal, a plurality of series circuits being connected in parallel between the internal node and the second power supply.

14. The PLL circuit as defined in claim 13, wherein a plurality of circuits are connected in parallel with each other between the internal node and the second power supply, each of said circuits being comprised of a switch element and a capacitor serially connected in said interpolator and the plurality of switch elements are turned on or off by a control signal applied to control terminals of said plurality of switch elements to thereby decide a capacitance attached to the internal node.

15. The PLL circuit as defined in claim 13, wherein a plurality of circuits are connected in parallel with each other between the internal node and the second power supply, each of said circuits being comprised of a switch element and a capacitor serially connected in said interpolator and the plurality of switch elements are turned on or off by a control signal applied to control terminals of said plurality of switch elements to thereby decide a capacitance attached to the internal node.

16. The PLL circuit as defined in claim 13, wherein each of said second, third, fourth and fifth switch elements in said interpolator comprises at least a prescribed number (K) of elements;

L-number (where L is 0 to K) of said third switch elements are turned on by weighting signals applied to said group of third switch elements;

(K–L)-number of said fifth switch elements are turned on by weighting signals applied to said fifth switch elements; and a signal is output that corresponds to a timing obtained by internally dividing the timing difference between the first and second input signals based upon K using 1/K of this timing difference as a unit, and the internal ratio of the timing difference is varied by varying the value of L.

17. The PLL circuit as defined in 13, wherein said phase adjusting circuit comprises a plurality of said interpolators arranged in at least two stages;

the two frequency-divided clocks obtained by integral frequency division are input to respective ones of two input terminals of each of two interpolators of a first stage; and two outputs from said two interpolators of said first stage are input to respective ones of two input terminals of an interpolator of a second stage.

18. The PLL circuit as defined in claim 17, wherein one interpolator of the two interpolators of said first stage is such that its interior division ratio for dividing a timing difference between the two inputs is made a fixed value, and the other interpolator of said first stage is such that its internal ratio for dividing the timing difference is controlled so as to be variable.

* * * * *